(12) United States Patent
Tian et al.

(10) Patent No.: US 11,522,110 B2
(45) Date of Patent: Dec. 6, 2022

(54) LIGHT-EMITTING DIODE CHIP, METHOD FOR FABRICATING THE SAME, BACKLIGHT MODULE, AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Ting Tian, Beijing (CN); Yawen Zhang, Beijing (CN); Ming Zhai, Beijing (CN); Dayong Zhou, Beijing (CN); Jinge Zhao, Beijing (CN); Pan Guo, Beijing (CN); Shuqian Dou, Beijing (CN); Xiaoliang Fu, Beijing (CN); Zhiqiang Fan, Beijing (CN); Meijuan An, Beijing (CN); Liguang Deng, Beijing (CN); Yongjie Han, Beijing (CN)

(73) Assignees: Beijing BOE Optoelectronics Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 930 days.

(21) Appl. No.: 16/335,572

(22) PCT Filed: Oct. 17, 2018

(86) PCT No.: PCT/CN2018/110712
§ 371 (c)(1),
(2) Date: Mar. 21, 2019

(87) PCT Pub. No.: WO2019/179086
PCT Pub. Date: Sep. 26, 2019

(65) Prior Publication Data
US 2020/0013935 A1    Jan. 9, 2020

(30) Foreign Application Priority Data

Mar. 19, 2018 (CN) .......................... 201810225286.1

(51) Int. Cl.
*H01L 33/58* (2010.01)
*G02F 1/1333* (2006.01)
(Continued)

(52) U.S. Cl.
CPC ............ *H01L 33/58* (2013.01); *G02F 1/1337* (2013.01); *G02F 1/1339* (2013.01);
(Continued)

(58) Field of Classification Search
None
See application file for complete search history.

(56) References Cited

U.S. PATENT DOCUMENTS 7,075,114 B2    7/2006   Abe et al.
2004/0227145 A1   11/2004   Abe et al.
(Continued)

FOREIGN PATENT DOCUMENTS

CN          2852189 Y    12/2006
CN       107256862 A    10/2017
(Continued)

OTHER PUBLICATIONS

Chinese First Office Action for Application No. CN201810225286.1, dated Mar. 5, 2019.
(Continued)

*Primary Examiner* — Ryan Crockett
(74) *Attorney, Agent, or Firm* — ArentFox Schiff LLP; Michael Fainberg

(57) ABSTRACT

This disclosure discloses a light-emitting diode chip, a method for fabricating the same, a backlight module, and a display device. The light-emitting diode chip includes: a
(Continued)

transparent base substrate; at least one light-emitting diode located on one side of the base substrate; and a dimming structure located on a side of the base substrate away from the light-emitting diode, wherein the light-emitting diode is configured to emit light from double sides thereof; and the dimming structure is configured to adjust the intensity of light emitted from the side of the base substrate away from the light-emitting diode.

19 Claims, 17 Drawing Sheets

(51) Int. Cl.
| | | |
|---|---|---|
| *G02F 1/1335* | (2006.01) | |
| *G02F 1/1337* | (2006.01) | |
| *G02F 1/1339* | (2006.01) | |
| *G02F 1/1343* | (2006.01) | |
| *H01L 25/075* | (2006.01) | |
| *H01L 33/00* | (2010.01) | |
| *H01L 33/38* | (2010.01) | |
| *H01L 33/54* | (2010.01) | |
| *G03B 15/05* | (2021.01) | |
| *H01L 33/62* | (2010.01) | |

(52) U.S. Cl.
CPC .... *G02F 1/13439* (2013.01); *G02F 1/133351* (2013.01); *G02F 1/133528* (2013.01); *G02F 1/134309* (2013.01); *H01L 25/0753* (2013.01); *H01L 33/0095* (2013.01); *H01L 33/38* (2013.01); *H01L 33/54* (2013.01); *G02F 1/133562* (2021.01); *G02F 1/133567* (2021.01); *G02F 2201/16* (2013.01); *G02F 2201/44* (2013.01); *G03B 15/05* (2013.01); *H01L 33/62* (2013.01); *H01L 2933/0016* (2013.01); *H01L 2933/0058* (2013.01)

(56) References Cited

U.S. PATENT DOCUMENTS

| | | | | |
|---|---|---|---|---|
| 2005/0200275 A1* | 9/2005 | Tsai | ...................... | H01L 27/322 313/504 |
| 2007/0019416 A1* | 1/2007 | Han | ................... | G02B 19/0028 362/310 |
| 2011/0310458 A1* | 12/2011 | Lee | ........................... | E06B 9/24 359/318 |
| 2014/0167626 A1* | 6/2014 | Kim | ...................... | H01L 51/504 315/161 |
| 2015/0314731 A1* | 11/2015 | Popp | ....................... | G02F 1/157 359/267 |
| 2019/0019839 A1 | 1/2019 | Tian et al. | | |
| 2020/0013935 A1* | 1/2020 | Tian | ...................... | G02F 1/1339 |

FOREIGN PATENT DOCUMENTS

| | | |
|---|---|---|
| CN | 107611237 A | 1/2018 |
| CN | 107799017 A | 3/2018 |
| CN | 108445694 A | 8/2018 |

OTHER PUBLICATIONS

International Search Report for PCT/CN2018/110712, dated Oct. 17, 2018.

* cited by examiner

LIGHT-EMITTING DIODE CHIP, METHOD FOR FABRICATING THE SAME, BACKLIGHT MODULE, AND DISPLAY DEVICE

CROSS-REFERENCES TO RELATED APPLICATIONS

This application claims priority to Chinese Patent Application No. 201810225286.1, filed with the Chinese Patent Office on Mar. 19, 2018, and entitled "Light-emitting diode chip, method for fabricating the same, backlight module, and display device", which is hereby incorporated by reference in its entirety.

FIELD

The present disclosure relates to the field of display technologies, and particularly to a light-emitting diode chip, a method for fabricating the same, a backlight module, and a display device.

BACKGROUND

A double-sided Light-Emitting Diode (LED) emits light from both the top side and the bottom side thereof upon being powered on, but the intensity of the light emitted from either of the sides cannot be controlled individually.

SUMMARY

An embodiment of this disclosure provides a light-emitting diode chip. The light-emitting diode chip includes: a transparent base substrate; at least one light-emitting diode located on one side of the base substrate; and a dimming structure located on a side of the base substrate away from the light-emitting diode, wherein the light-emitting diode is configured to emit light from double sides thereof; and the dimming structure is configured to adjust an intensity of light emitted from the side of the base substrate away from the light-emitting diode.

Optionally in the embodiment of this disclosure, the dimming structure includes: an opposite substrate; a liquid crystal layer located between the base substrate and the opposite substrate; a first polarization layer located on a side of the liquid crystal layer away from the opposite substrate; a second polarization layer located on a side of the liquid crystal layer away from the first polarization layer; deflection electrodes, located between the base substrate and the opposite substrate, configured to control liquid crystal molecules in the liquid crystal layer to be deflected; a first alignment film located on the side of the liquid crystal layer away from the opposite substrate; a second alignment film located on a side of the liquid crystal layer away from the first alignment film; and sealant, located between the first alignment film and the second alignment film, configured to seal the liquid crystal layer.

Optionally in the embodiment of this disclosure, the deflection electrodes include a first deflection electrode and a second deflection electrode; the dimming structure further includes: a first via-hole and a second via-hole arranged on the opposite substrate, a first electrode arranged on the opposite substrate away from the base substrate, and corresponding to the first via-hole, and a second electrode arranged on the side of the opposite substrate away from the base substrate, and corresponding to the second via-hole; and the first deflection electrode is connected with the first electrode through the first via-hole, and the second deflection electrode is connected with the second electrode through the second via-hole.

Optionally in the embodiment of this disclosure, the first deflection electrode is located on the side of the liquid crystal layer away from the opposite substrate, and the second deflection electrode is located on the side of the liquid crystal layer away from the first deflection electrode.

Optionally in the embodiment of this disclosure, the dimming structure further includes a third electrode located on the opposite substrate facing the base substrate; an orthographic projection of the third electrode onto the base substrate lies out of a closed-loop structure defined by an orthographic projection of the sealant onto the base substrate; and the first deflection electrode is connected with the third electrode, and the third electrode is connected with the first electrode through the first via-hole.

Optionally in the embodiment of this disclosure, the base substrate is made of a conductive material; the first polarization layer is located on the side of the first deflection electrode proximate to the opposite substrate; and the base substrate is further used as the first deflection electrode and a cathode of the light-emitting diode.

Optionally in the embodiment of this disclosure, the first deflection electrode and the second deflection electrode are arranged at the same layer, and the first deflection electrode and the second deflection electrode are arranged to be insulated from each other.

Optionally in the embodiment of this disclosure, the first deflection electrode and the second deflection electrode are located on the side of the liquid crystal layer away from the opposite substrate; the dimming structure further includes a fourth electrode and a fifth electrode located on the side of the opposite substrate facing the base substrate; the orthographic projections of the fourth electrode and the fifth electrode onto the base substrate lie out of a closed-loop structure defined by the orthographic projection of the sealant onto the base substrate; the first deflection electrode is connected with the fourth electrode, and the fourth electrode is connected with the first electrode through the first via-hole; and the second deflection electrode is connected with the fifth electrode, and the fifth electrode is connected with the second electrode through the second via-hole.

Optionally in the embodiment of this disclosure, the first deflection electrode and the second deflection electrode are located on the side of the liquid crystal layer facing the opposite substrate.

Optionally in the embodiment of this disclosure, the orthographic projection of the second polarization layer onto the opposite substrate does not overlap with the first via-hole and the second via-hole.

Optionally in the embodiment of this disclosure, the dimming structure further includes: a first electrically-conductive material filled in the first via-hole, and a second electrically-conductive material filled in the second via-hole; the first deflection electrode is connected with the first electrode through the first conductive material; and the second deflection electrode is connected with the second electrode through the second conductive material.

Correspondingly an embodiment of this disclosure further provides a backlight module including the light-emitting diode chip according to the embodiment above of this disclosure.

Optionally in the embodiment of this disclosure, the backlight module further includes an encapsulation bracket configured to encapsulate the light-emitting diode chip; the encapsulation bracket includes a first light exit and a second light exit arranged opposite to each other; light emitted from the light-emitting diode chip from the side of the base substrate facing the light-emitting diode exits at the first light exit, and the light emitted from the light-emitting diode chip from the side of the base substrate away from the light-emitting diode exits at the second light exit.

Optionally in the embodiment of this disclosure, the backlight module further includes: a frame including an accommodating chamber, and a blocking wall surrounding the frame; the frame is arranged with a dodge groove in correspondence to the second light exit of the encapsulation bracket; and the blocking wall is arranged with a third light exit in correspondence to the dodge groove.

Correspondingly an embodiment of this disclosure further provides a display device including the backlight module according to the embodiment of this disclosure.

Optionally in the embodiment of this disclosure, the display device further includes: a housing and a light transmission structure; a light-supplementing hole is arranged on the housing; and the light transmission structure includes: a light entrance corresponding to the third light exit of the backlight module, a light exit corresponding to the light-supplementing hole, a light-shielding structure which is openable and closable located at the light exit, and a control module configured to control the extent to which the light-shielding structure is closed and opened.

Correspondingly an embodiment of this disclosure further provides a method for fabricating the light-emitting diode chip above. The method includes: forming a plurality of light-emitting diodes on one side of the transparent base substrate; forming a plurality of dimming structures on a side of the base substrate away from the light-emitting diodes to form a plurality of light-emitting diode chips, wherein the dimming structures each correspond to at least one of the light-emitting diodes; and segmenting the formed plurality of light-emitting diode chip into single light-emitting diode chips.

Optionally in the embodiment of this disclosure, forming the plurality of dimming structures on the side of the base substrate away from the light-emitting diodes includes: forming first polarization layers, first deflection electrodes of the dimming structures, a plurality of third electrodes connected respectively with the first deflection electrodes, and first alignment films of the dimming structures successively on the side of the base substrate away from the light-emitting diodes; patterning the opposite substrate to form first via-holes and second via-holes of the dimming structure; and forming a plurality of first electrodes corresponding respectively to the first via-holes, and a plurality of second electrodes corresponding respectively to the second via-holes on one side of the opposite substrate, and forming second polarization layers on the surface of the opposite substrate; forming second deflection electrodes of the dimming structures on the side of the opposite substrate away from the first electrodes, and connecting the second deflection electrodes with the second electrodes through the second via-holes; forming the corresponding second alignment films, and sealants in a closed-loop structure, on the second deflection electrodes; and dropping liquid crystals with the sealants to form liquid crystal layers of the dimming structures; and assembling the base substrate and the opposite substrate by arranging the side of the base substrate including the first alignment films to face the side of the opposite substrate including the liquid crystal layers, and connecting the third electrodes with the first electrodes through the corresponding first via-holes.

Optionally in the embodiment of this disclosure, forming the plurality of dimming structures on the side of the base substrate away from the light-emitting diodes includes: forming first polarization layers on the side of the base substrate away from the light-emitting diodes, and forming first deflection electrodes and second deflection electrodes of the dimming structures on the first polarization layers in the same patterning process; forming a plurality of fourth electrodes connected respectively with the first deflection electrodes, a plurality of fifth electrodes connected respectively with the second deflection electrodes, and first alignment films of the dimming structures, on the layer where the first deflection electrodes and the second deflection electrodes are located; patterning the opposite substrate to form first via-holes and second via-holes of the dimming structures, forming a plurality of first electrodes corresponding respectively to the first via-holes, and a plurality of second electrodes corresponding respectively to the second via-holes, on one side of the opposite substrate, and forming second polarization layers on the surface of the opposite substrate; forming second alignment films of the dimming structures, and sealants in a closed-loop structure, on the opposite substrate, and dropping liquid crystals within the sealants to form liquid crystal layers of the dimming structures; and assembling the base substrate and the opposite substrate by arranging the side of the base substrate including the first alignment films to face the side of the opposite substrate including the liquid crystal layers, connecting the fourth electrodes with the first electrodes through the corresponding first via-holes, and connecting the fifth electrodes with the second electrodes through the corresponding second via-holes.

Optionally in the embodiment of this disclosure, forming the plurality of dimming structures on the side of the base substrate away from the light-emitting diodes includes: forming first polarization layers on the side of the base substrate away from the light-emitting diodes, and forming first alignment films of the dimming structures on the first polarization layers; patterning the opposite substrate to form first via-holes and second via-holes of the respective dimming structures, forming a plurality of first electrodes corresponding respectively to the first via-holes, and a plurality of second electrodes corresponding respectively to the second via-holes, on one side of the opposite substrate, and forming second polarization layers on the surface of the opposite substrate; forming first deflection electrodes and second deflection electrodes of the dimming structures on the opposite substrate in the same patterning process, connecting the first deflection electrodes with the first electrodes through the first via-holes, and connecting the second deflection electrodes with the second electrodes through the second via-holes; forming second alignment films of the dimming structures, and sealants in a closed-loop structure, on the layer where the first deflection electrodes and the second deflection electrodes are located, and dropping liquid crystals within the sealants to form liquid crystal layers of the dimming structures; and assembling the base substrate and the opposite substrate by arranging the side of the base substrate including the first alignment films to face the side of the opposite substrate including the liquid crystal layers.

Figure 1:
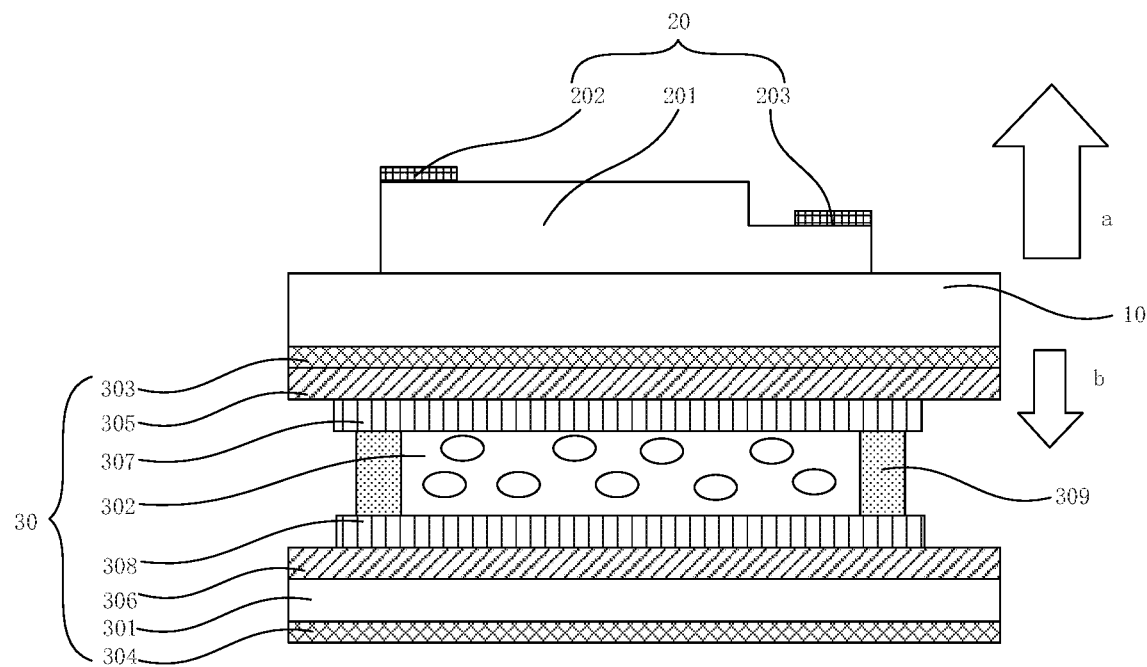
FIG. 1 is a first schematic structural diagram of a light-emitting diode chip according to an embodiment of this disclosure.

Reference numerals: 10—base substrate; 20—light-emitting diode; 201—epitaxial structure; 202—anode; 203—cathode; 30—dimming structure; 301—opposite substrate; 302—liquid crystal layer; 303—first polarization layer; 304—second polarization layer; 305—first deflection electrode; 306—second deflection electrode; 307—first alignment film; 308—second alignment film; 309—sealant; 310—first via-hole; 311—second via-hole; 312—first electrode; 313—second electrode; 314—third electrode; 315—fourth electrode; 316—fifth electrode; 40—backlight module; 41—encapsulation bracket; 411—first light exit; 412—second light exit; 413—first leading-out electrode; 414—second leading-out electrode; 415—third leading-out electrode; 416—fourth leading-out electrode; 42—frame; 421—dodge groove; 43—blocking wall; 431—third light exit; 50—housing; 501—cover plate; 502—light-supplementing hole; 503—pad; 60—light-transmitting structure; 601—light entrance; 602—light exit; 603—light-shielding structure; 604—control module.

DETAILED DESCRIPTION

In order to make the objects, the technical solutions, and the advantages of this disclosure more apparent, this disclosure will be described below in further details with reference to the drawings, and apparently the embodiments to be described are only a part but not all of the embodiments of this disclosure, and only intended to illustrate and explain this disclosure, but not intended to limit this disclosure thereto. Furthermore the embodiments of this disclosure, and the features in the embodiments can be combined with each other unless they conflict with each other, and based upon the embodiments here of this disclosure, all the other embodiments which can occur to those ordinarily skilled in the art without any inventive effort shall fall into the claimed scope of this disclosure.

It shall be noted that the shapes and the sizes of respective components in the drawings are not intended to reflect any real proportion, but only intended to illustrate this disclosure. Furthermore the same or similar reference numerals throughout the drawings will refer to the same or similar elements, or elements with same or similar functions.

As illustrated in FIG. 1, a light-emitting diode chip according to an embodiment of this disclosure includes: a transparent base substrate 10; at least one light-emitting diode 20 located on one side of the base substrate 10; and a dimming structure 30 located on the side of the base substrate 10 away from the light-emitting diode 20.

The light-emitting diode 20 is configured to emit light from double sides thereof.

The dimming structure 30 is configured to adjust the intensity of light emitted from one side of the base substrate 10 away from the light-emitting diode 20.

In the light-emitting diode chip according to the embodiment of this disclosure, the dimming structure is arranged on the side of the base substrate away from the light-emitting diode, to adjust the intensity of light emitted from the side of the base substrate away from the light-emitting diode, so as to individually control the intensity of light emitted from one side of the double-sided light-emitting diode chip.

Referring to FIG. 1, the light-emitting diode 20 can emit light from double sides thereof, and the base substrate 10 is transparent, so that the light-emitting diode chip can emit light in the two directions of the arrow a and the arrow b. In the embodiment of this disclosure, for example, the light-emitting diode 20 emits light in the direction of the arrow a as a primary light exit side, and the light-emitting diode 20 emits light in the direction of the arrow b as a secondary light exit side, and in a specific implementation, the intensity of the light from the primary light exit side can be adjusted by adjusting voltage of the light-emitting diode 20, and the intensity of the light from the secondary light exit side can be adjusted by controlling the dimming structure, so that the intensity of the light from each of the two sides of the light-emitting diode chip can be controlled individually.

When the light-emitting diode chip above is applied to a display device, the light emitted from the primary light exit side can satisfy a normal display demand, and the light emitted from the secondary light exit side can act as a light source for supplementing light while photographing, without any additional separate light source as a light-supplementing lamp, thus lowering a cost, and narrowing a space to be occupied by the light-supplementing light source, which can cater to the miniaturization trend of a mobile terminal. Furthermore since the dimming structure can adjust the intensity of the light from the secondary light exit side, neither additional switch module nor additional light-supplementing component is installed in the display device, thus reducing the volume of the display device, and avoiding complex operating of additionally connected light-supplementing component, simplifying the structure and also saving the cost.

Specifically the light-emitting diode 20 can include an epitaxial structure 201, an anode 202, and a cathode 203. When the light-emitting diode 20 is a P-N junction diode, the anode 202 can be a P electrode, and the cathode 203 can be an N electrode. The base substrate 10 can be made of the transparent insulating material, and for example, the base substrate 10 can be made of the sapphire material. Moreover the light-emitting diode chip above includes at least one light-emitting diode 20, and in order to control the intensity of light more precisely, the light-emitting diode chip can further include more light-emitting diodes 20, but the number of light-emitting diodes 20 will not be limited here.

Specifically in the light-emitting diode chip above according to the embodiment of this disclosure, as illustrated in FIG. 1, the dimming structure 30 includes: an opposite substrate 301; a liquid crystal layer 302 located between the base substrate 10 and the opposite substrate 301; a first polarization layer 303 located on the side of the liquid crystal layer 302 away from the opposite substrate 301; a second polarization layer 304 located on the side of the liquid crystal layer 302 away from the first polarization layer 303; deflection electrodes, located between the base substrate 10 and the opposite substrate 301, configured to control liquid crystal molecules in the liquid crystal layer 302 to be deflected; a first alignment film 307 located on the side of the liquid crystal layer 302 away from the opposite substrate 301; a second alignment film 308 located on the side of the liquid crystal layer 302 away from the first alignment film 307; and a sealant 309, located between the first alignment film 307 and the second alignment film 308, configured to seal the liquid crystal layer 302.

Figure 2:
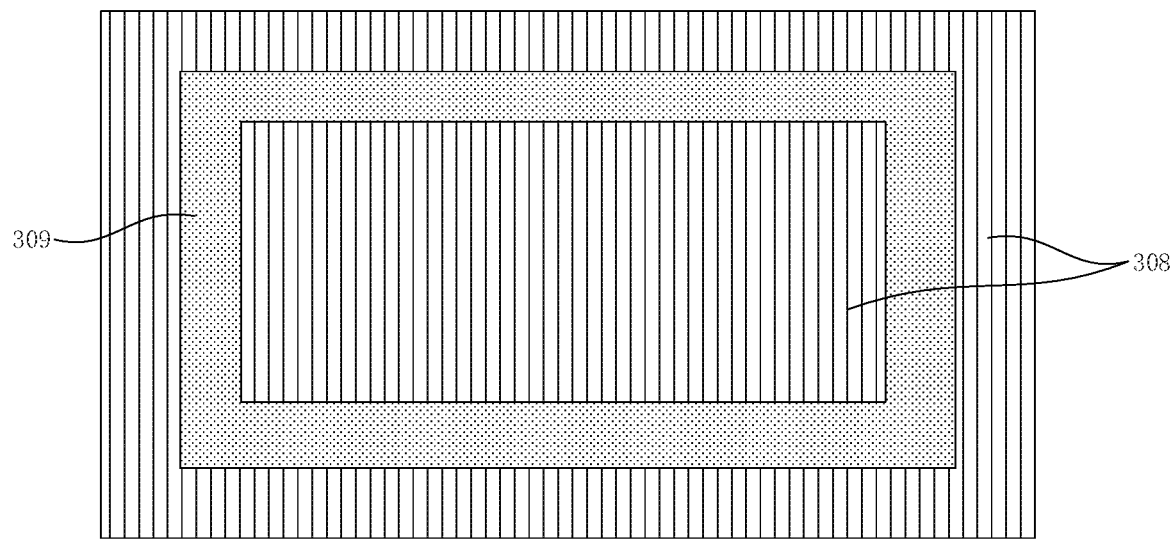
FIG. 2 is a top view of the layer where sealant is located in the direction of the arrow b in FIG. 1.

In a specific implementation, optical axes of the first polarization layer 303 and the second polarization layer 304 are perpendicular to each other, and an initial state of the liquid crystal molecules in the liquid crystal layer 302 is a state of arrangement parallel or perpendicular to the optical axes. The first polarization layer 303 and the second polarization layer 304 can be film layers with polarization properties, or can be directly adhered polarizer, although the embodiment of this disclosure will not be limited thereto. The first alignment film 307 and the second alignment film 308 are located on two sides of the liquid crystal layer 302 so that the liquid crystal molecules can be arranged in the correct direction at some pre-inclination angle. Also referring to FIG. 2, the sealant 309 form a closed loop structure, liquid crystals are accommodated in the closed-loop structure to form a liquid crystal layer 401, and the closed-loop structure can prevent the liquid crystals from being leaked, to thereby seal the liquid crystal layer 302. The sealant 309 can overlap partially or fully with the second alignment film 308 (or the first alignment film 307) as long as the liquid crystal layer 302 can be sealed. The opposite substrate 301 can be a transparent glass material, or can be a transparent ceramic material or another transparent insulating material.

The deflection electrodes are transparent conductive electrodes made of e.g., one or more of Indium Tin Oxide (ITO) or graphite olefin, or of another transparent conductive material, although the embodiment of this disclosure will not be limited thereto. In a specific implementation, the liquid crystal molecules in the liquid crystal layer 302 can be controlled to be deflected by applying voltage to the deflection electrodes, to thereby vary the light transmittance of the liquid crystal layer 302 so as to vary the intensity of light passing through the liquid crystal layer 302. In the embodiment of this disclosure, the light transmittance of the liquid crystal layer is varied by controlling the liquid crystal molecules in the liquid crystal layer to be deflected, to thereby adjust the intensity of the light from the secondary light exit side simply in a simplified structure, thus facilitating the adjustment and the fabrication.

There may be a number of implementations of the deflection electrodes in the dimming structure above in a real application as to be described below in details with reference to the drawings.

In the light-emitting diode chip above according to the embodiment of this disclosure, as illustrated in FIG. 3 to FIG. 7, the deflection electrodes include a first deflection electrode 305 and a second deflection electrode 306.

The dimming structure 30 can further include: a first via-hole 310 and a second via-hole 311 arranged on the opposite substrate 301, a first electrode 312 arranged on the side of the opposite substrate 301 away from the base substrate 10 and corresponding to the first via-hole 310, and a second electrode 313 arranged on the side of the opposite substrate 301 away from the base substrate 10 and corresponding to the second via-hole 313.

The first deflection electrode 305 is connected with the first electrode 312 through the first via-hole 310, and the second deflection electrode 306 is connected with the second electrode 313 through the second via-hole 311.

In a real application, the dimming structure above applies voltage to the first deflection electrode 305 and the second deflection electrode 306, so that the liquid crystal molecules in the liquid crystal layer 302 lie in an electric field and can be controlled to be deflected by controlling the intensity of the electric field, to thereby vary the light transmittance of the liquid crystal layer 302.

In order to lead out the first deflection electrode 305 and the second deflection electrode 306, in the embodiment of this disclosure, the first via-hole 310 and the second via-hole 311 are arranged in the opposite substrate 301, the first electrode 312 and the second electrode 313 are arranged on the side of the opposite substrate 301 away from the base substrate 10, the first deflection electrode 305 is connected with the first electrode 312 through the first via-hole 310, and the second deflection electrode 306 is connected with the second electrode 313 through the second via-hole 311, so that the first deflection electrode 305 and the second deflection electrode 306 are led out from the side of the opposite substrate 301 away from the base substrate 10, thus enabling the light-emitting diode chip to be fabricated in array to thereby improve the production efficiency and lower the fabrication cost.

In a specific implementation, in the embodiment of this disclosure, referring to FIG. 3 to FIG. 7, the dimming structure above can further include: a first conductive material filled in the first via-hole 310, and a second conductive material filled in the second via-hole 311.

The first deflection electrode 305 is connected with the first electrode 312 through the first conductive material.

The second deflection electrode 306 is connected with the second electrode 313 through the second conductive material.

Stated otherwise, after the first via-hole 310 and the second via-hole 311 are formed on the opposite substrate 301 through punching, the conductive materials can be filled in the first via-hole 310 and the second via-hole 311 so that subsequently the first deflection electrode 305 is connected with the first electrode 312, and the second deflection electrode 306 is connected with the second electrode 313; and the first conductive material may or may not be the same as the second conductive material, although the embodiment of this disclosure will not be limited thereto.

For example, the first conductive material is the same as the second conductive material, and they are copper, so the first via-hole 310 and the second via-hole 311 can be filled as follows: specifically an adhesive layer and a copper seed layer are deposited at the first via-hole 310 and the second via-hole 311 in a Physical Vapor Deposition (PVD), Plasma Enhanced Chemical Vapor Deposition (PECVD), Plasma Enhanced Chemical Vapor Deposition (PECVD), or magnetically controllable spraying process, and since the adhesive layer has a good adhesion factor, the copper seed layer can be well adhered to the opposite substrate 301, the copper seed layer can be a conductive electrode during electroplating, the first via-hole 310 and the second via-hole 311 can be subsequently filled by a copper electro-plating process to form metal via-holes, and then superfluous copper is removed in a chemical-mechanical polishing, grinding or etching process, and the via-holes are planarized. Moreover the first via-hole 310 and the second via-hole 311 can alternatively be filled with another material, and the embodiment of this disclosure will not be limited to any specific filling material.

Moreover in a specific implementation, during fabricating of the first electrode 312, the first via-hole 310 can be filled directly with the material of the first electrode 312, and during fabricating of the second electrode 313, the second via-hole 311 can be filled directly with the material of the second electrode 313, or the deflection electrodes can be fabricated by filling the first via-hole 310 and the second via-hole 311 or otherwise, although the embodiment of this disclosure will not be limited thereto.

Figure 3:
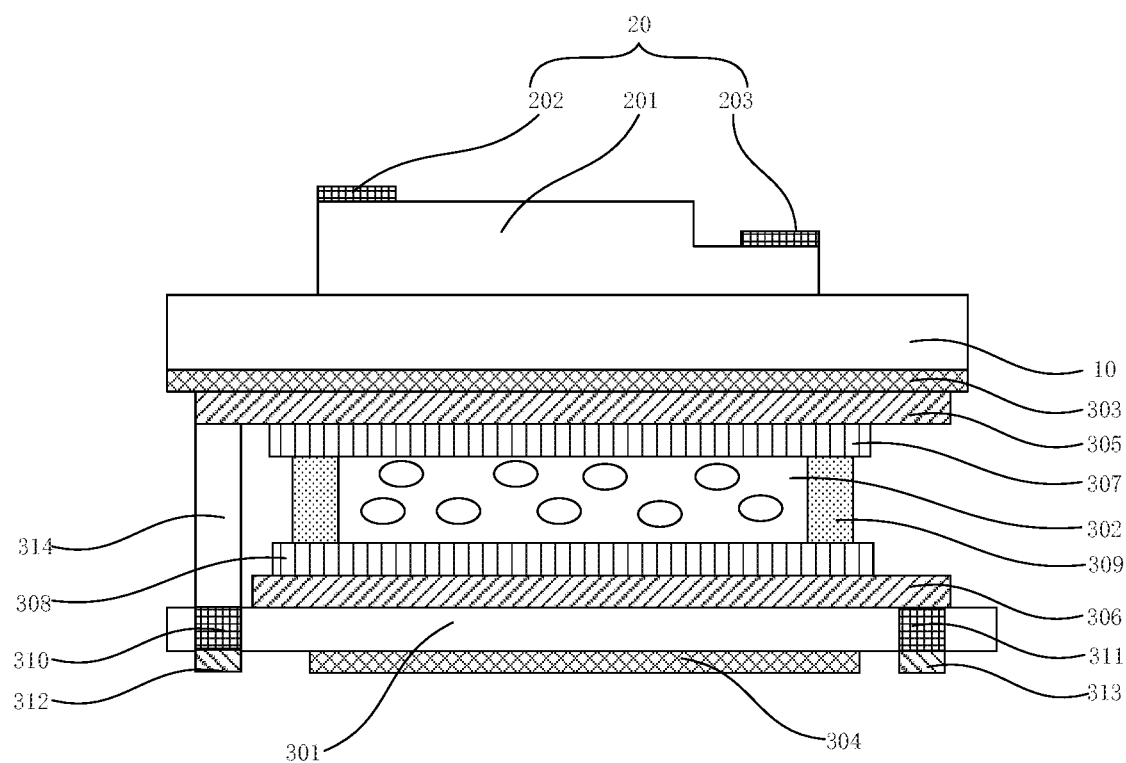
FIG. 3 is a second schematic structural diagram of the light-emitting diode chip according to the embodiment of this disclosure.

As illustrated in FIG. 3, the first deflection electrode 305 and the second deflection electrode 306 can be located on two sides of the liquid crystal layer 302, and for example, the first deflection electrode 305 can be located on the side of the liquid crystal layer 302 away from the opposite substrate 301, and the second deflection electrode 306 can be located on the side of the liquid crystal layer 302 away from the first deflection electrode 305.

In a specific implementation, the positions of the first deflection electrode 305 and the first polarization layer 303 can be swapped, and the positions of the second deflection 306 and the second polarization layer 304 can be swapped. Moreover the first polarization layer 303 is generally located between the base substrate 10 and the liquid crystal layer 302, and the second polarization layer 304 can be located between the opposite substrate 301 and the liquid crystal layer 302, or can be located on the side of the opposite substrate 301 away from the liquid crystal layer 302.

In order to extend the first deflection electrode 305 out, in the embodiment of this disclosure, as illustrated in FIG. 3, the dimming structure above can further include a third electrode 314 located on the side of the opposite substrate 301 facing the base substrate 10.

The orthographic projection of the third electrode 314 onto the base substrate 10 lies out of a closed-loop structure defined by the orthographic projection of the sealant 309 onto the base substrate 10.

The first deflection electrode 305 is connected with the third electrode 314, and the third electrode 314 is connected with the first electrode 312 through the first via-hole 310.

Since the first deflection electrode 305 is located on the side of the liquid crystal layer 302 away from the opposite substrate 301, that is, the first deflection electrode 305 is farther from the first electrode 312, the third electrode 314 can be arranged so that the first deflection electrode 305 is led out to the first electrode 312; and the orthographic projection of the third electrode 314 onto the base substrate 10 lies out of the closed-loop structure defined by the orthographic projection of the sealant 309 onto the base substrate 10, that is, the third electrode 314 lies out of a closed-loop structure defined by the sealant 309, and the third electrode 314 cannot pass the liquid crystal layer 302, so the sealing effect of the liquid crystal layer 302 cannot be affected by the third electrode 312. The third electrode 314 can be a gold ball.

Figure 4:
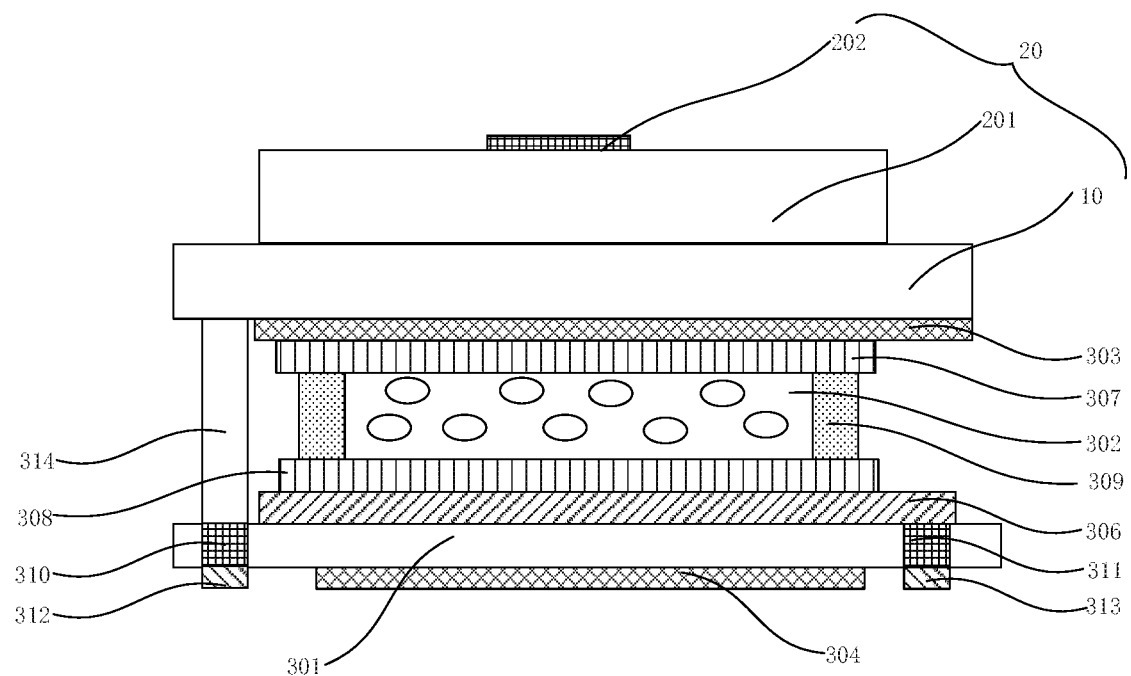
FIG. 4 is a third schematic structural diagram of the light-emitting diode chip according to the embodiment of this disclosure.

In a specific implementation, in the light-emitting diode chip above according to the embodiment of this disclosure, as illustrated in FIG. 4, the base substrate 10 is made of a conductive material.

The first polarization layer 303 is located on the side of the first deflection electrode 305 proximate to the opposite substrate 301.

The base substrate 10 is further used as the first deflection electrode 305 and the cathode 203 of the light-emitting diode.

Since the base substrate 10 is made of a transparent conductive material, the base substrate 10 can act as both the cathode 202 of the light-emitting diode 20 and the first deflection electrode 305 in the dimming structure. When the light-emitting diode is a P-N junction diode, the cathode 202 is an N electrode, thus reducing the thickness of the light-emitting diode chip, and simplifying the fabrication process of the light-emitting diode chip. In a specific implementation, the base substrate 10 can be made of a transparent conductive material, e.g., silicon carbide (SiC), and the epitaxial structure 201 and the anode 202 located on the side of the epitaxial structure 201 away from the base substrate 10 are formed on one side of the base substrate 10, thus resulting in the light-emitting diode 20; and the first polarization layer 303, the first alignment film 307, etc., are formed on the side of the base substrate 10 away from the light-emitting diode 20, thus resulting in the dimming structure, The intensity of light from the secondary light exit face can be adjusted by applying voltage between the base substrate 10 and the second deflection electrode 306 to control the liquid crystal molecules in the liquid crystal layer 302 to be deflected, so as to improve the light transmittance of the liquid crystal layer 302.

Figure 5:
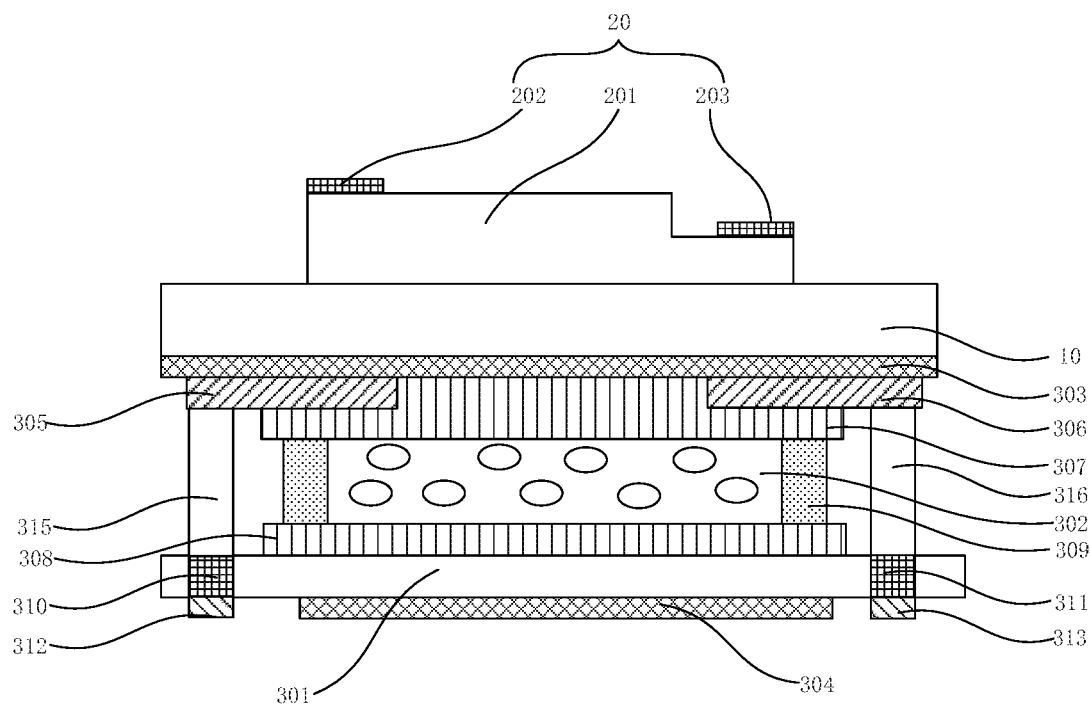
FIG. 5 is a fourth schematic structural diagram of the light-emitting diode chip according to the embodiment of this disclosure.
Figure 6:
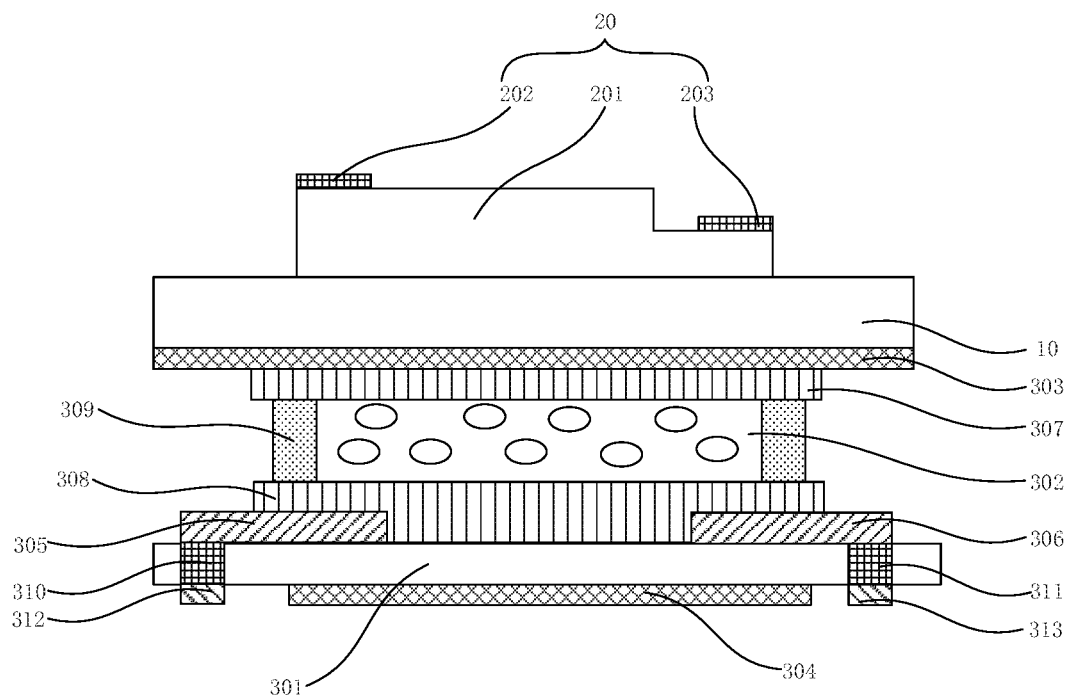
FIG. 6 is a fifth schematic structural diagram of the light-emitting diode chip according to the embodiment of this disclosure.

Moreover in the light-emitting diode chip above according to the embodiment of this disclosure, as illustrated in FIG. 5 and FIG. 6, the first deflection electrode 305 and the second deflection electrode 306 can be arranged at the same layer, and the first deflection electrode 305 and the second deflection electrode 306 are insulated from each other.

Since the first deflection electrode 305 and the second deflection electrode 306 are arranged at the same layer, the liquid crystal molecules in the liquid crystal layer 302 can be rotated in a specified direction under the transverse electric field, to thereby control the amount of light to be transmitted. Furthermore the dimming structure can be fabricated by fabricating the first deflection electrode 305 and the second deflection electrode 306 in the same patterning process to thereby dispense with one patterning process so as to simplify the process flow, and to reduce the thickness of the dimming structure.

In order to extend out the first deflection electrode 305 and the second deflection electrode 306, in the embodiment of this disclosure, as illustrated in FIG. 5, the first deflection electrode 305 and the second deflection electrode 306 are located on the side of the liquid crystal layer 302 away from the opposite substrate 301.

The dimming structure can further include a fourth electrode 315 and a fifth electrode 316 located on the side of the opposite substrate 301 facing the base substrate 10.

The orthographic projections of the fourth electrode 315 and the fifth electrode 316 onto the base substrate 10 lie out of the closed-loop structure defined by the orthographic projection of the sealant 309 onto the base substrate 10.

The first deflection electrode 305 is connected with the fourth electrode 315, and the fourth electrode 315 is connected with the first electrode 312 through the first via-hole 310.

The second deflection electrode 306 is connected with the fifth electrode 316, and the fifth electrode 316 is connected with the second electrode 313 through the second via-hole 311.

Since both the first deflection electrode 305 and the second deflection electrode 306 are located on the side of the liquid crystal layer 302 away from the opposite substrate 301, that is, the first deflection electrode 305 is farther from the first electrode 312, and the second deflection electrode 306 is farther from the second electrode 313, the fourth electrode 315 is arranged so that the first deflection electrode 305 can be led out to the first electrode 312, and the fifth electrode 316 is arranged so that the second deflection electrode 306 can be led out to the second electrode 313; and the orthographic projections of the fourth electrode 315 and the fifth electrode 316 onto the base substrate 10 lie out of the closed-loop structure defined by the orthographic projection of the sealant 309 onto the base substrate 10, that is, the fourth electrode 315 and the fifth electrode 316 lie out of the closed-loop structure defined by sealant 309, and the fourth electrode 315 and the fifth electrode 316 cannot pass the liquid crystal layer 302, so the fourth electrode 315 and the fifth electrode 316 can be arranged without affecting the sealing effect of the liquid crystal layer 302.

As illustrated in FIG. 6, in the light-emitting diode chip above according to the embodiment of this disclosure, the first deflection electrode 305 and the second deflection electrode 306 are located on the side of the liquid crystal layer 302 facing the opposite substrate 301.

In a specific implementation, the second polarization layer 304 can be arranged on the side of the opposite substrate 301 away from the liquid crystal layer 302, so the first deflection electrode 305 and the second deflection electrode 306 can directly contacts with the opposite substrate 301 to lead out the first deflection electrode 305 and the second deflection electrode 306.

Moreover the second polarization layer 304 can alternatively be arranged on the side of the opposite substrate 301 proximate to the liquid crystal layer 302, and in order to lead out the first deflection electrode 305 and the second deflection electrode 306, via-holes corresponding to the first via-hole 310 and the second via-hole 311 can be arranged respectively on the second polarization layer 304 so that the first deflection electrode 305 and the second deflection electrode 306 are led out, or the coverage area of the second polarization layer 304 can be narrowed so that the orthographic projection of the second polarization layer 304 onto the opposite substrate 301 does not overlap with the first via-hole 310 and the second via-hole 311, so the first deflection electrode 305 is connected with the first electrode 312 through the first via-hole 310, and the second deflection electrode 306 is connected with the second electrode 313 through the second via-hole 311.

In a real application, in the light-emitting diode chip above according to the embodiment of this disclosure, as illustrated in FIG. 3 to FIG. 6, the orthographic projection of the second polarization layer 304 onto the opposite substrate 301 does not overlap with the first via-hole 310 and the second via-hole 311. The second polarization layer 304 can be arranged on the surface of the opposite substrate 301, and in order to avoid the second polarization layer 304 from shielding the first via-hole 310 and the second via-hole 311, and thus hindering the first deflection electrode 305 and the second deflection electrode 306 from being led out, the orthographic projection of the second polarization layer 304 onto the opposite substrate 301 does not overlap with the first via-hole 310 and the second via-hole 311, the coverage area of the second polarization layer 304 can be narrowed, or the second polarization layer 304 can be punched in correspondence to the first via-hole 310 and the second via-hole 311.

Figure 7:
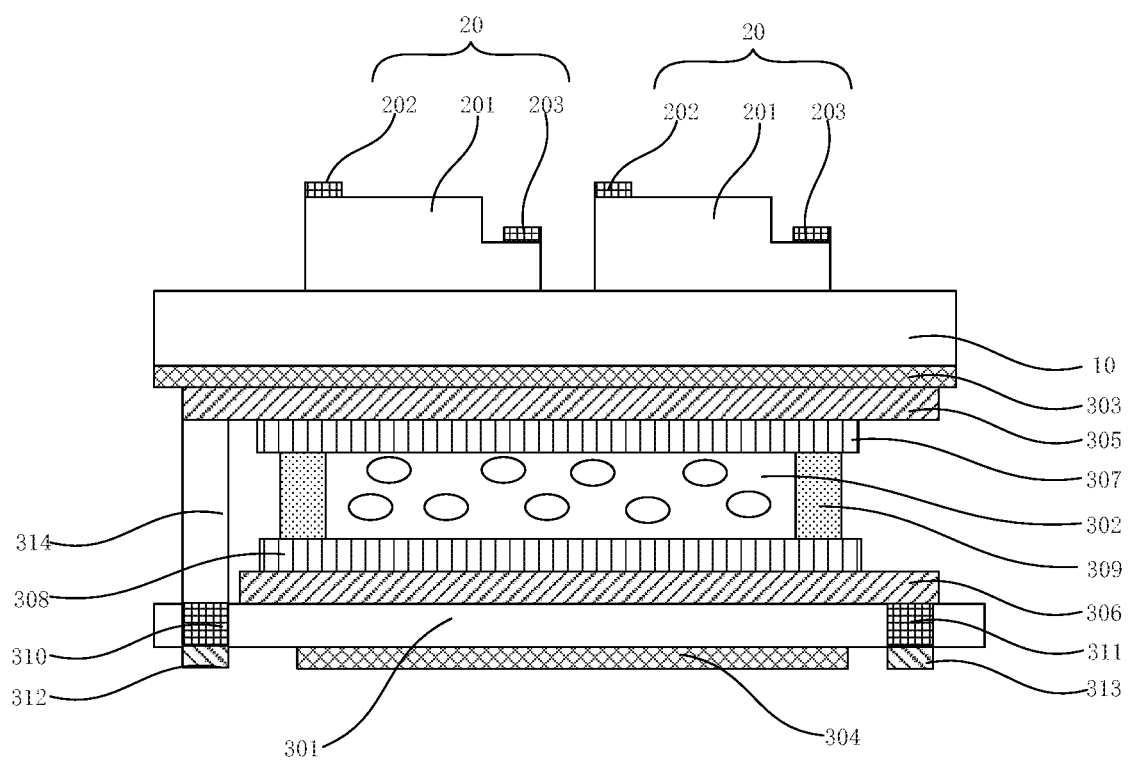
FIG. 7 is a sixth schematic structural diagram of the light-emitting diode chip according to the embodiment of this disclosure.

As illustrated in FIG. 7, in the light-emitting diode chip above according to the embodiment of this disclosure, the dimming structure above can correspond to two or more light-emitting diodes 20, that is, a closed loop structure defined by the sealant 309 can correspond to two or more light-emitting diodes 20, and as illustrated in FIG. 7, one dimming structure corresponds to two light-emitting diodes 20, for example, but one dimming structure can alternatively correspond similarly to more light-emitting diodes 20, although a repeated illustration thereof will be omitted here. Moreover FIG. 7 illustrates the dimming structure which is the same as the dimming structure as illustrated in FIG. 3 only by way of an example, and in a specific implementation, the dimming structure as illustrated in FIG. 4 to FIG. 6 can also correspond to two or more light-emitting diodes 20, although a repeated illustration thereof will be omitted here.

Based upon the same inventive idea, an embodiment of this disclosure farther provides a backlight module. The backlight module includes the light-emitting diode chip above. All the other components indispensable to the backlight module shall readily occur to those ordinarily skilled in the art, so a repeated description thereof will be omitted here, and this disclosure will not be limited thereto. Reference can be made to the embodiment of the light-emitting diode chip above for an implementation of the backlight module, and a repeated description thereof will be omitted here.

Figure 8:
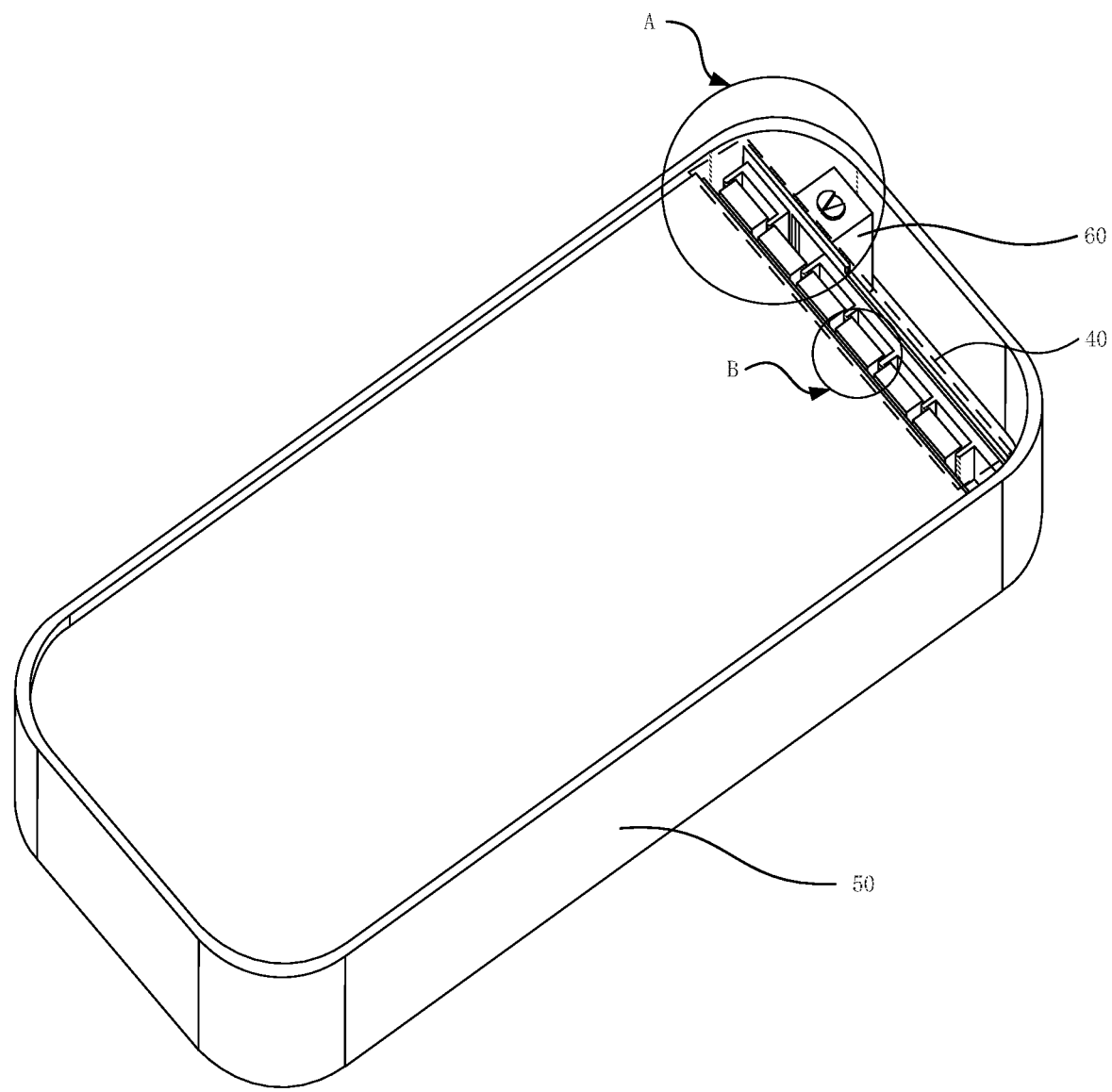
FIG. 8 is a first schematic structural diagram of a display device according to an embodiment of this disclosure.

FIG. 8 illustrates a schematic structural diagram of a display device according to an embodiment of this disclosure, where a part of components of the backlight module are represented in the dotted box 40, and the backlight module further includes other components which are not illustrated in FIG. 8, e.g., a light-guiding plate, a diffusing plate, etc.

Figure 9:
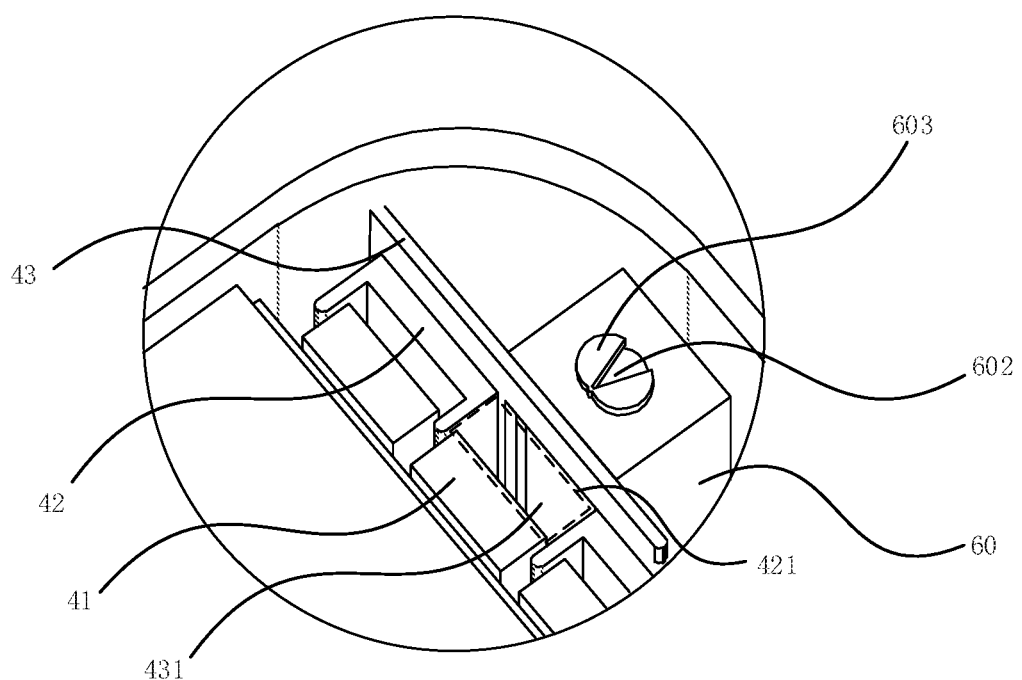
FIG. 9 is a schematic magnified view of A in FIG. 8.
Figure 10:
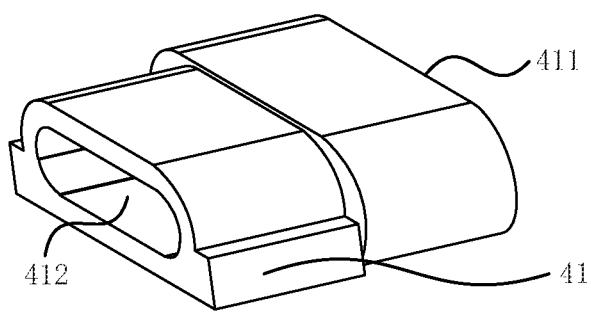
FIG. 10 is a schematic magnified view of B in FIG. 8.

FIG. 9 is a schematic magnified view of the circle A in FIG. 8, and FIG. 10 is a schematic magnified view of the circle B in FIG. 8; and as illustrated in FIG. 9 and FIG. 10, the backlight module above according to the embodiment of this disclosure can further include an encapsulation bracket 41 configured to encapsulate the light-emitting diode chip.

The encapsulation bracket 41 includes a first light exit 411 and a second light exit 412 arranged opposite to each other.

The light emitted from the light-emitting diode chip from the side of the base substrate facing the light-emitting diode exits at the first light exit 411, and the light emitted from the light-emitting diode chip from the side of the base substrate away from the light-emitting diode exits at the second light exit 412.

Stated otherwise, the light emitted from the light-emitting diode chip above at the primary light exit side exits at the first light exit 411, and the light emitted from the light-emitting diode chip above at the secondary light exit side exits at the second light exit 412. The light-emitting diode chip is encapsulated using the encapsulation bracket 41 including the first light exit 411 and the second light exit 412 so that the light can emitted from the light-emitting diode chip at double sides thereof. The light emitted from the light-emitting diode chip at the first light exit 411 side can act as a backlight source while an image is being displayed on the display panel; and the light emitted from the light-emitting diode chip at the second light exit 412 side can act as a light source for supplementing light while photographing, and for example, they can provide a camera with a light source for supplementing light while photographing in a mobile phone, a notebook computer, a tablet computer, or another display device including the camera. Moreover fluorescent powder, e.g., yellow fluorescent powder, or fluorescent powder in another color, can be coated on two sides of the light-emitting diode in the encapsulation bracket 41.

In a specific implementation, each backlight source in the backlight module above can be the light-emitting diode chip above capable of emitting light from double sides thereof, or the backlight module can be arranged as needed in reality to include a plurality of light-emitting diode chips capable of emitting light from single side thereof and a plurality of light-emitting diode chips capable of emitting light from double sides thereof, where the number of light-emitting diode chips capable of emitting light from double sides thereof can be determined as needed in an application scenario of the backlight module.

Furthermore in order to enable the light emitted from the fight-emitting diode chip at the secondary light exit side to exit the backlight module, in the backlight module above according to the embodiment of this disclosure, as illustrated in FIG. 9, the backlight module can further include: a frame 42 having an accommodating chamber, and a blocking wall 43 surrounding the flame 42.

The frame 42 is arranged with a dodge groove 421 in correspondence to the second light exit 412 of the encapsulation bracket 41.

The blocking wall 43 is arranged with a third light exit 431 in correspondence to the dodge groove 421.

The dodge groove 421 is arranged in the frame 42, and the third light exit 431 is arranged in the blocking wall 43, so that the light emitted from the light-emitting diode chip passes the encapsulation bracket 41, and then exits at the third light exit 431 through the dodge groove 421, so the light emitted from the light-emitting diode chip at the secondary light exit side can act as a supplementing light source. FIG. 9 illustrates one light-emitting diode chip capable of emitting light from double sides thereof, one dodge groove, and one third light exit 431 only by way of an example, but in a specific implementation, the number of light-emitting diode chips capable of emitting from double sides thereof, and the numbers of dodge grooves 421 and third light exits 431 corresponding to the light-emitting diode chips can be arranged as needed for supplementing light, although the embodiment of this disclosure will not be limited thereto.

Figure 11:
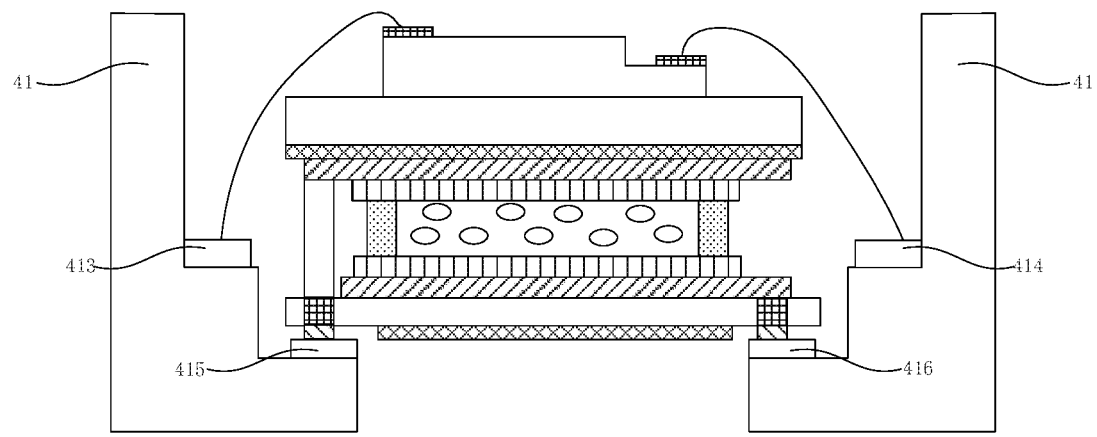
FIG. 11 is a first schematic structural diagram of the inside of an encapsulation bracket.

Specifically as illustrated in FIG. 11, taking the light-emitting diode chip as illustrated in FIG. 3 as an example, the encapsulation bracket 41 can include: a first leading-out electrode 413, a second leading-out electrode 414, a third leading-out electrode 415, and a fourth leading-out electrode 416. The first leading-out electrode 413 and the second leading-out electrode 414 are configured to lead out the anode and the cathode of the light-emitting diode, and the third leading-out electrode 415 and the fourth leading-out electrode 416 are configured to lead out the first deflection electrode and the second deflection electrode in the dimming structure; and specifically the first leading-out electrode 413 can be connected with the anode of the light-emitting diode, the second leading-out electrode 414 can be connected with the cathode of the light-emitting diode, the third leading-out electrode 415 can be connected with the first electrode in the dimming structure, and the fourth leading-out electrode 416 can be connected with the second electrode in the dimming structure. Specifically the first leading-out electrode and the second leading-out electrode can be electrically connected respectively with the anode and the cathode of the light-emitting diode through wire solder, and the third leading-out electrode and the fourth leading-out electrode can be electrically connected respectively with the first deflection electrode and the second deflection electrode in the dimming structure through bonding.

In a specific implementation, the respective leading-out electrodes in the encapsulation bracket 41 can be located on the same side of the encapsulation bracket, and when the first light exit 411 and the second light exit 412 of the encapsulation bracket 41 are located on the side surface thereof, then the respective leading-out electrodes may be led out from the bottom, and when the first light exit 411 and the second light exit 412 are located on the top surface and the bottom surface of the encapsulation bracket 41, then the respective leading-out electrodes may be led out from the side surface.

Figure 12:
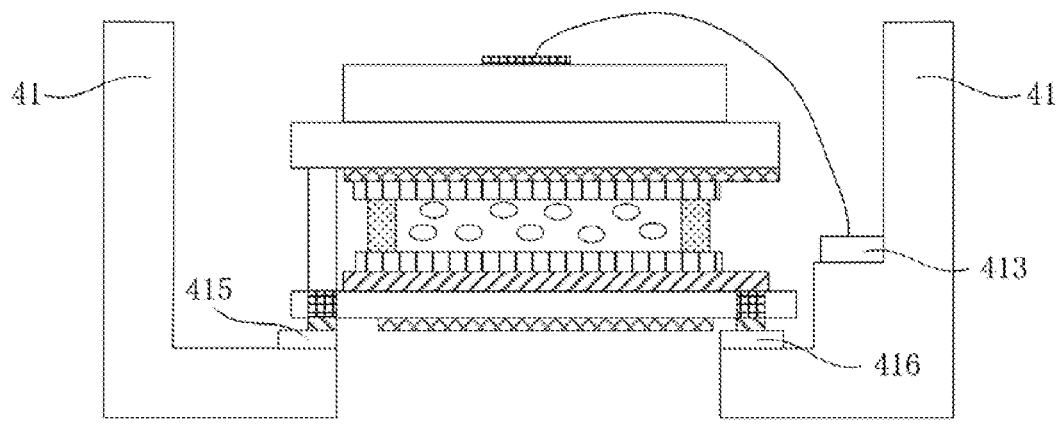
FIG. 12 is a second schematic structural diagram of the inside of the encapsulation bracket.

In the structure of the light-emitting diode chip as illustrated in FIG. 4, it can be encapsulated using the encapsulation bracket 41 as illustrated in FIG. 12, and since the base substrate in FIG. 4 is made of a transparent conductive material, it can be further used as the cathode in the light-emitting diode and the first deflection electrode, so the encapsulation bracket 41 as illustrated in FIG. 12 can dispense with the first leading-out electrode as compared with the encapsulation bracket 41 as illustrated in FIG. 11.

Figure 13:
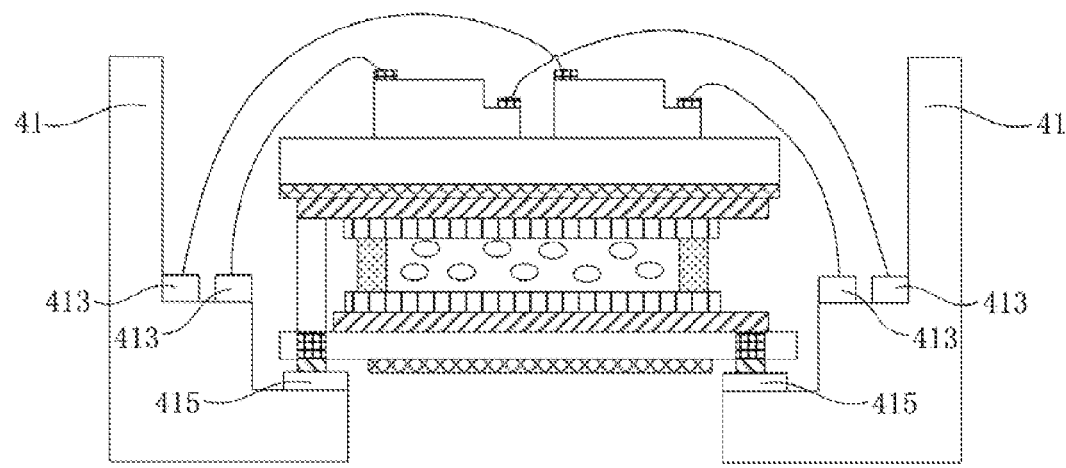
FIG. 13 is a third schematic structural diagram of the inside of the encapsulation bracket.

Since there is the same number of electrodes to be lead out in FIG. 5 and FIG. 6, the structures as illustrated in FIG. 5 and FIG. 6 can alternatively be encapsulated using the encapsulation bracket 41 as illustrated in FIG. 11. When the light-emitting diode chip as illustrated in FIG. 7 includes two or more light-emitting diodes, when the respective light-emitting diodes are to be controlled individually, then there may be larger numbers of first leading-out electrodes 413 and second leading-out electrodes 414 as illustrated in FIG. 13. When the light-emitting diode chip includes more than two light-emitting diodes, then there may be correspondingly larger numbers of first leading-out electrodes 413 and second leading-out electrodes 414 like the structure as illustrated in FIG. 13, although a detailed illustration thereof will be omitted here. When the same voltage is applied to the respective light-emitting diode chips, then the light-emitting diode chip as illustrated in FIG. 7 may alternatively be encapsulated using the encapsulation bracket 41 as illustrated in FIG. 11.

Based upon the same inventive idea, an embodiment of this disclosure farther provides a display device including the backlight module above according to the embodiment of this disclosure. The display device can be a mobile phone, a tablet computer, a TV set, a display, a notebook computer, a digital photo frame, a navigator, or any other product or component with a display function. All the other components indispensable to the display device shall readily occur to those ordinarily skilled in the art, so a repeated description thereof will be omitted here, and this disclosure will not be limited thereto. Reference can be made to the embodiment of the backlight module above for an implementation of the display device, and a repeated description thereof will be omitted here.

Figure 14:
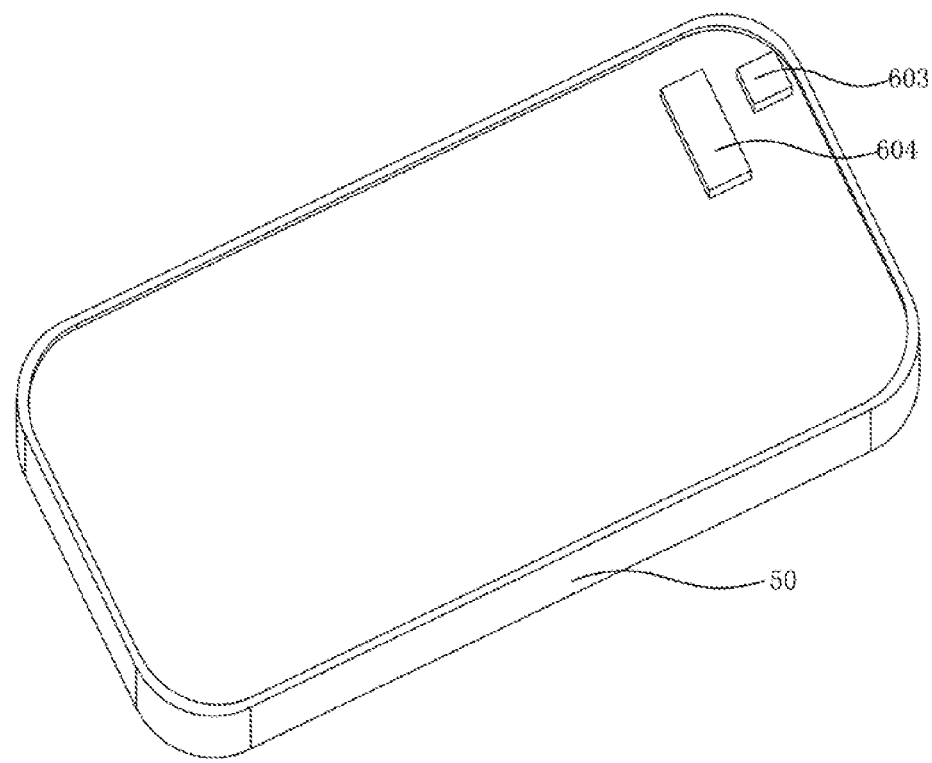
FIG. 14 is a second schematic structural diagram of the display device according to the embodiment of this disclosure.
Figure 15:
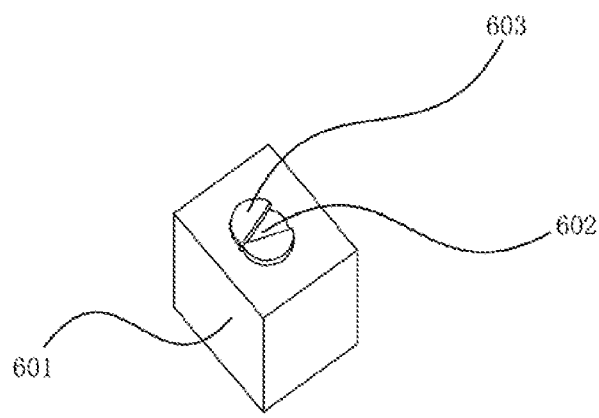
FIG. 15 is a schematic structural diagram of a light transmission structure according to an embodiment of this disclosure.
Figure 16:
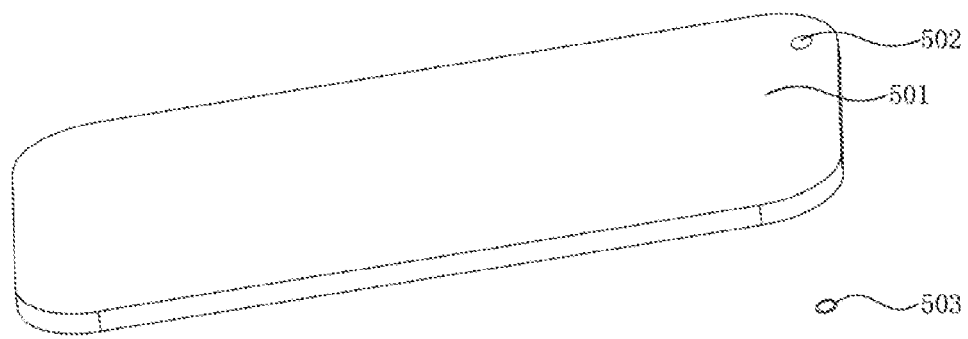
FIG. 16 is a third schematic structural diagram of the display device according to the embodiment of this disclosure.
Figure 16:
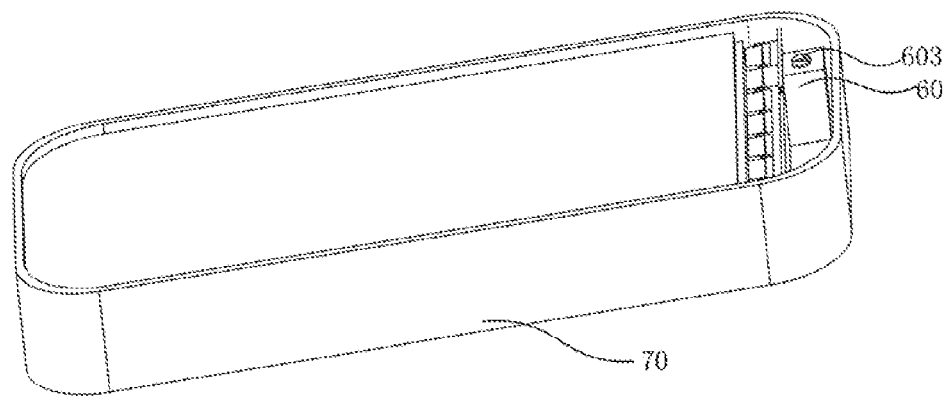

FIG. 8, FIG. 14, and FIG. 16 are schematic structural diagrams of a display device according to an embodiment of this disclosure, FIG. 9 is a schematic magnified view at the circle A in FIG. 8, and FIG. 15 is a schematic a magnified view of a light transmission structure.

As illustrated in FIG. 8, FIG. 9, and FIG. 14 to FIG. 16, in the display device above according to the embodiment of this disclosure, the display device can further include: a housing 50 and a light transmission structure 60.

A light-supplementing hole 502 is arranged on the housing 50.

The light transmission structure 60 can include: a light entrance 601 corresponding to the third light exit 431 of the backlight module, a light exit 602 corresponding to the light-supplementing hole 502, a light-shielding structure 603, which is openable and closable, located at the light exit 602, and a control module 304 configured to control the extent to which the light-shielding structure 603 is closed and opened.

As illustrated in FIG. 8 and FIG. 9, the light transmission structure 60 is located in correspondence to the encapsulation bracket 41, and the light emitted from the light-emitting diode chip exits at the second light exit of the encapsulation bracket 41, then passes the dodge groove 421 on the frame 42, and the third light exit 431 on the blocking wall 43, and is further transmitted to the light entrance of the light transmission structure 60, and since there is a light path for transmitting light in the light transmission structure 60, the light transmitted through the light transmission structure 60 exits at the light exit, and the light-shielding structure 603 which is openable and closable, is arranged at the light exit to thereby control the intensity of the light exiting from the light-supplementing hole 502. In a specific implementation, the light transmission structure 60 can be embodied as a relay switch module or another switching component, or can be embodied as another component, although the embodiment of this disclosure will not be limited thereto. Since the display device is usually lightened, the light transmission structure can be arranged to control the light at the light-supplementing hole, and when no light needs to be supplemented, then the light-shielding structure may be controlled to shield all the light to thereby avoid the light from being leaked at the light-supplementing hole in the display device; and when light needs to be supplemented for photographing, then the light-shielding structure may be controlled by the control module to be opened so that the light can exit from the light-supplementing hole to supplement the light, and the intensity of the supplemented light at the light-supplementing hole may can be further adjusted through the control module as needed in reality.

As illustrated in FIG. 14, the light-shielding structure 603 and the control module 604 can be arranged inside the housing 50, and be proximate to the camera of the display device (e.g., a mobile phone, a notebook computer, a tablet computer, etc.), the control module 604 can be arranged on a main hoard of the display device, the light-shielding structure 603 can be connected with the control module 604, and a control signal can be transmitted by the display device, so that the light-shielding structure 603 can be controlled separately through the control module 604, and thus the extent to which the light-shielding structure 603 is opened and closed can be controlled in different scenarios to thereby control a valid area in which the light can be transmitted at the light exit of the light transmission structure 60, so as to control the intensity of the supplemented light exiting the light-supplementing hole, thus satisfying demands of different photographers for supplementing the light in the different scenarios.

In a real application, the intensity of the light exiting the light-supplementing hole can be adjusted by controlling the voltage between the cathode and the anode of the light-emitting diode, controlling the voltage of the first deflection electrode and the second deflection electrode in the dimming structure, controlling the extent to which the light-shielding structure is opened and closed, etc., in different scenarios, to thereby satisfy demands for supplementing the light in the different scenarios, so as to improve the photographing effect of the display device. As can be appreciated, the intensity of the light exiting the light-supplementing hole can also be adjusted by controlling the voltage between the cathode and the anode of the light-emitting diode, and controlling the extent to which the light-shielding structure is opened and closed, the display device according to the embodiment of this disclosure can include only a light-emitting diode chip capable of emitting light from double sides thereof, i.e., a light-emitting diode chip capable of emitting light from double sides thereof without any dimming structure. Moreover in the case that at least two light-emitting diode chips capable of emitting light from double sides thereof needs to be arranged, the display device may include a combination of a light-emitting diode chip including the dimming structure and a light-emitting diode chip capable of emitting light from double sides thereof, as needed in reality.

In order to control the light-emitting diode chip above conveniently, the first deflection electrode and the second deflection electrode in the light-emitting diode chip can be lead out through a Flexible Printed Circuit (FPC), and connected with the main board of the display device through a primary FPC, and the main board can power the light-emitting diode chip, and control the light-emitting diode chip to emit light.

As illustrated in FIG. 16, in order to protect the display device, the housing 50 further includes a removable cover plate 501, where the cover plate 501 can be made of a transparent insulating material, and is configured to enable the light emitted from the light-emitting diode chip at the first light exit to pass to thereby display an image. Moreover a pad 503 can be further arranged between the cover plate 501 and the light transmission structure 60, where the pad 503 is annular, and corresponds to the light-supplementing hole 502, and the pad 502 can prevent such a friction from occurring between the light transmission structure 60 and the cover plate 501 that would otherwise scratch the surface of the cover plate, and also prevent light from leaked out of the cover plate.

Moreover referring to FIG. 8 and FIG. 9, when there is a middle frame between the blocking wall 43 in the backlight module 40 and the light transmission structure 60, then the middle frame can be further punched in correspondence to the third light exit 431 of the blocking wall 43, so that the light is incident into the light transmission structure 60 at the third light exit 431.

In the display device above according to the embodiment of this disclosure, since the light-emitting diode chip in the backlight module can emit light from two double thereof, and the intensities of the light emitted from the double sides can be controlled individually, the light exiting the primary light exit side can satisfy a normal display demand, and the light exiting the secondary light exit side can act as a light source for supplementing light while photographing, without any additional separate light source as a light-supplementing lamp, thus lowering a cost, and narrowing a space to be occupied by the light-supplementing light source, which can cater to the miniaturization trend of a mobile terminal. Furthermore since the dimming structure can adjust the intensity of the light from the secondary light exit side, neither additional switch module nor additional light-supplementing component needs to be installed in the display device, to thereby reduce the volume of the display device, and avoid complex operation of additionally connected light-supplementing component, thus simplifying the structure and also saving the cost.

Figure 17:
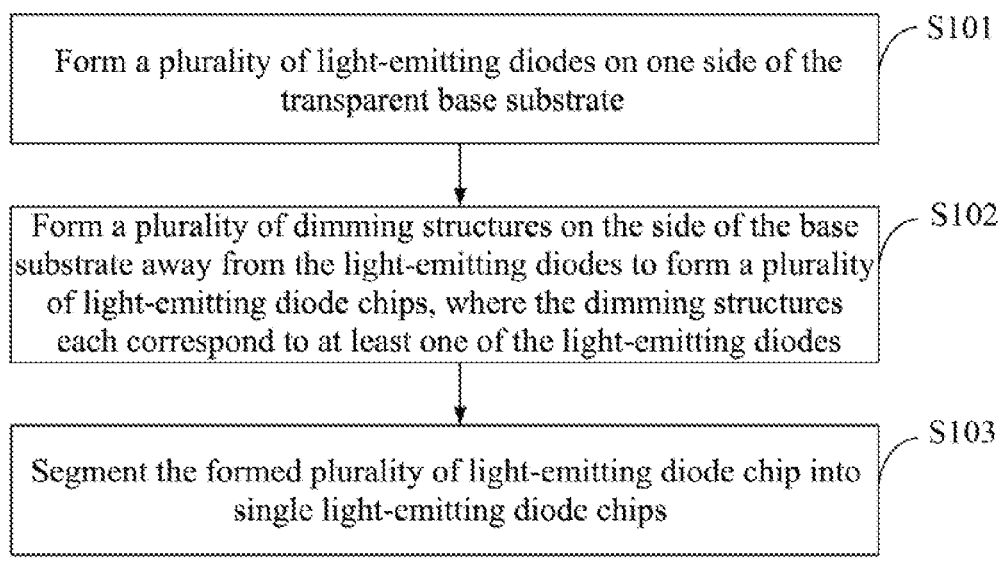
FIG. 17 is a first flow chart of a method for fabricating a light-emitting diode chip according to an embodiment of this disclosure.

Based upon the same inventive idea, an embodiment of this disclosure further provides a method for fabricating the light-emitting diode chip above, and as illustrated in FIG. 17, the method can include the following steps.

Figure 19A:
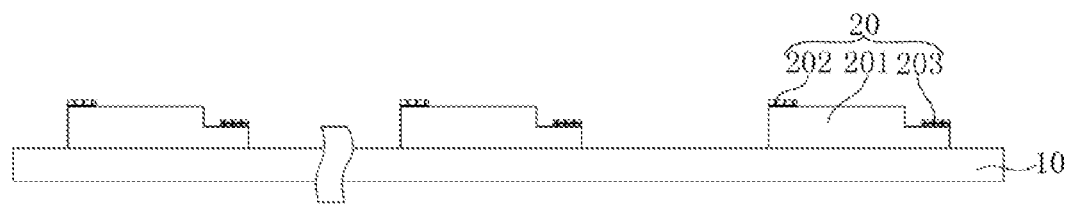
FIG. 19a to FIG. 19f are schematic structural diagrams corresponding to respective steps in the fabricating method according to the embodiment of this disclosure.

The step S101 is to form a plurality of light-emitting diodes 20 on one side of the transparent base substrate 10 as illustrated in FIG. 19a.

The step S102 is to form a plurality of dimming structures on the side of the base substrate 10 away from the light-emitting diodes to form a plurality of light-emitting diode chips, where the dimming structures each correspond to at least one of the light-emitting diodes.

The step S103 is to segment the plurality of formed light-emitting diode chip into single light-emitting diode chips.

Specifically in the step S101 above, both the anode 202 and the cathode 203 in the light-emitting diode 20 can be located on the side of the epitaxial structure 201 away from the base substrate 10. In a fabrication process, the epitaxial structures 201 of the respective light-emitting diodes 20 are formed on the base substrate 10, and the respective anodes 202 and the respective cathodes 203 are formed in correspondence to the epitaxial structures 201. In the step S103 above, the array of light-emitting diode chips can be segmented through scribing, splitting, etc.

In the method above for fabricating a light-emitting diode chip according to the embodiment of this disclosure, the dimming structures are formed on the side of the base substrate away from the light-emitting diodes so that the intensity of the light exiting from the side of the base substrate away from the light-emitting diodes can be adjusted. Furthermore the plurality of light-emitting diodes are formed on one side of the base substrate, and the plurality of dimming structures are formed on the other side of the base substrate, and thereafter the plurality of formed light-emitting diode chips are segmented, so that the light-emitting diode chips can be fabricated in an array efficiently at a low cost.

The method above for fabricating a light-emitting diode chip in a number of structures according to the embodiment of this disclosure will be described below in details with reference to the drawings.

Figure 18:
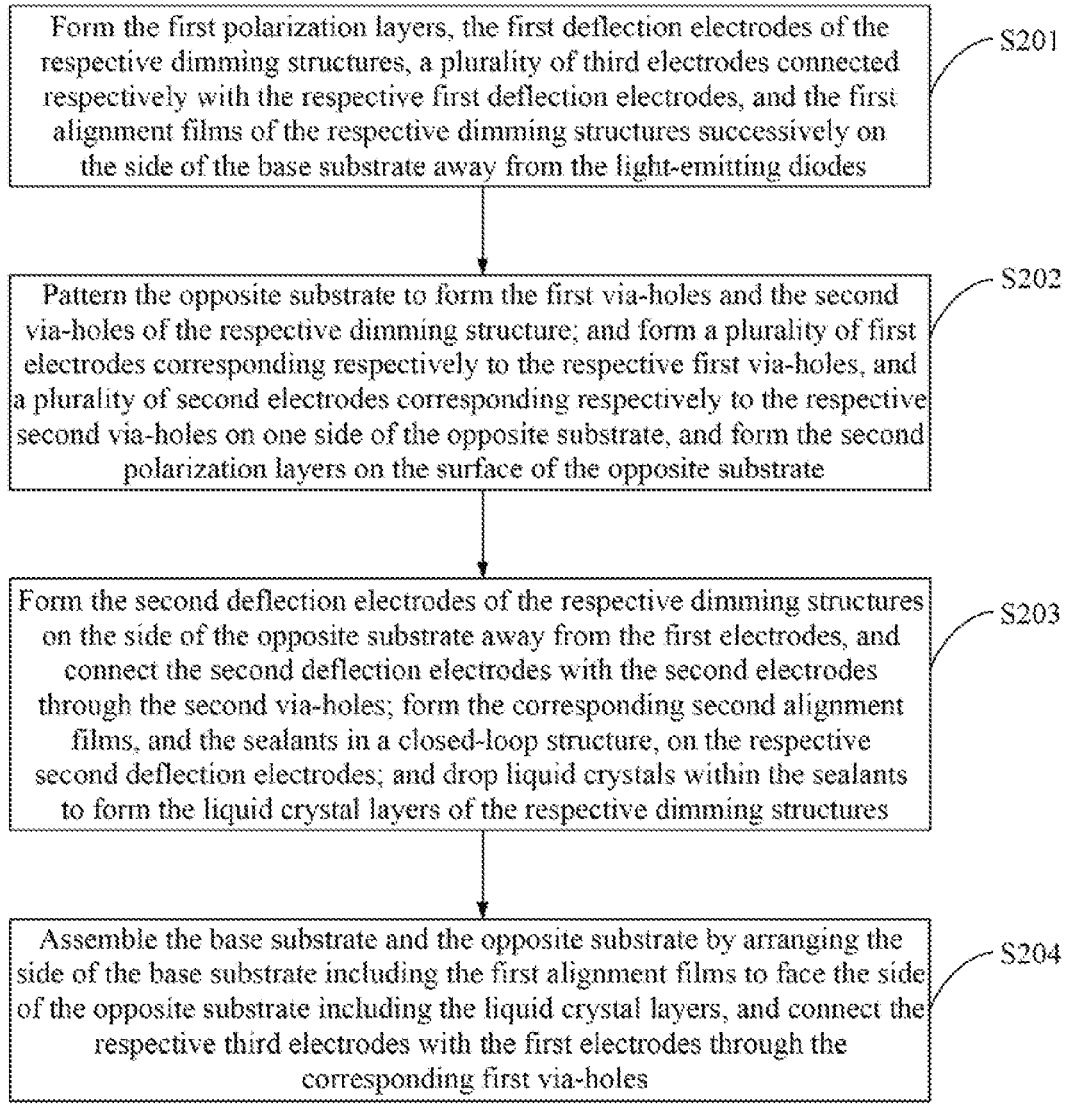
FIG. 18 is a second flow chart of the method for fabricating a light-emitting diode chip according to the embodiment of this disclosure.

For the structure as illustrated in FIG. 3 and FIG. 4 in which the first deflection electrode and the second deflection electrode are located respectively on two sides of the liquid crystal layer, as illustrated in FIG. 18, in the fabricating method above according to the embodiment of this disclosure, the step S102 above can include the following steps.

Figure 19B:
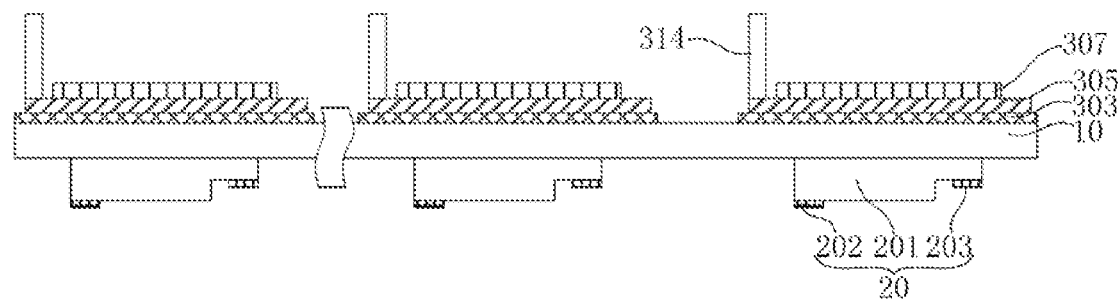

The step S201 is to form the first polarization layers 303, the first deflection electrodes 305 of the respective dimming structures, a plurality of third electrodes 314 connected respectively with the respective first deflection electrodes 305, and the first alignment films 318 of the respective dimming structures successively on the side of the base substrate 10 away from the light-emitting diodes 20 as illustrated in FIG. 19b. In a specific implementation, in order for the third electrodes 314 not to pass the liquid crystal layers subsequently formed, the third electrodes 314 can be formed at the edges of the first deflection electrodes 305. Since the dimming structures and the light-emitting diodes are located on different sides of the base substrate, the base substrate may be inverted by 180° after the structure as illustrated in FIG. 19a is formed, so that the dimming structures are formed on the other side of the base substrate.

Figure 19C:
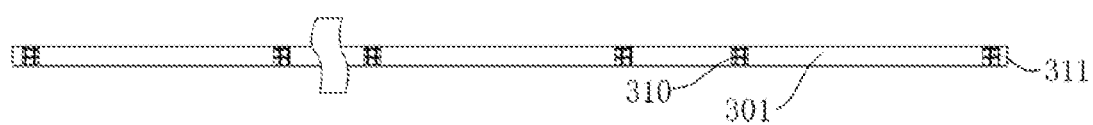
Figure 19D:
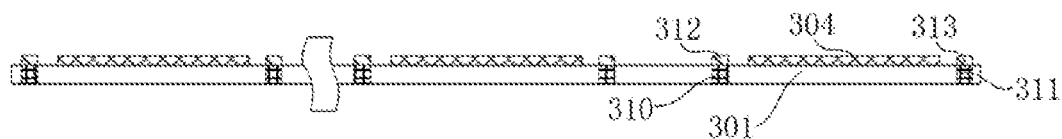

The step S202 is to pattern the opposite substrate 301 to form the first via-holes 310 and the second via-holes 311 of the respective dimming structure as illustrated in FIG. 19c; and to form a plurality of first electrodes 312 corresponding respectively to the respective first via-holes 310, and a plurality of second electrodes 313 corresponding respectively to the respective second via-holes 311 on one side of the opposite substrate 301, and to form the second polarization layers 304 on the surface of the opposite substrate 301, as illustrated in FIG. 19d.

In a specific implementation, the opposite substrate 301 can be made of a glass material or a transparent ceramic material, and the opposite substrate 301 can be patterned through punching to form the respective first via-holes 310 and the respective second via-holes 311. Moreover the conductive material can be filled in the first via-holes 310 and the second via-holes 311 so that subsequently the first deflection electrodes 305 are connected with the first electrodes 312, and the second deflection electrodes 306 are connected with the second electrodes 313. Specifically an adhesion layer and a copper seed layer can be deposited at the first via-holes 310 and the second via-holes 311 through a PVD, PECVD, or magnetically controllable spraying process, and since the adhesion layer has a good adhesion factor, the copper seed layer can be well adhered to the opposite substrate 301. The copper seed layer can be a conductive electrode during electro-plating, the first via-holes 310 and the second via-holes 311 can be subsequently filled in a copper electro-plating process to form metal via-holes, and then superfluous copper is removed in a chemical-mechanical polishing, grinding or etching process, and the via-holes are planarized. Moreover in a specific implementation, alternatively during the fabricating of the first electrodes 312, the first via-holes 310 can be filled directly with the material of the first electrodes 312, and during the fabricating of the second electrodes 313, the second via-holes 311 can be filled directly with the material of the second electrodes 313, or the first via-holes 310 and the second via-holes 311 can be filled during the fabricating of the deflection electrodes, or the via-holes can be filled otherwise, although the embodiment of this disclosure will not be limited thereto.

Figure 19E:
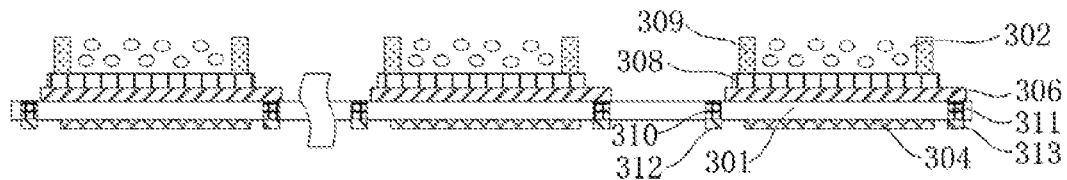

The step S203 is to form the second deflection electrodes 306 of the respective dimming structures on the side of the opposite substrate 301 away from the first electrodes 312, and to connect the second deflection electrodes 306 with the second electrodes 313 through the second via-holes 311; to form the corresponding second alignment films 308, and the sealants 309 in a closed-loop structure, on the respective second deflection electrodes 306; and to drop liquid crystals within the sealants to form the liquid crystal layers 302 of the respective dimming structures, as illustrated in FIG. 19e.

In the embodiment of this disclosure, the second polarization layers 304 are located on the side of the opposite substrate 301 away from the liquid crystal layers 302, for example, so after the second polarization layers 304 are formed, the opposite substrate 301 is inverted by 180°, and the respective layers in the step S203 are formed on the other side of the opposite substrate 301.

Figure 19F:
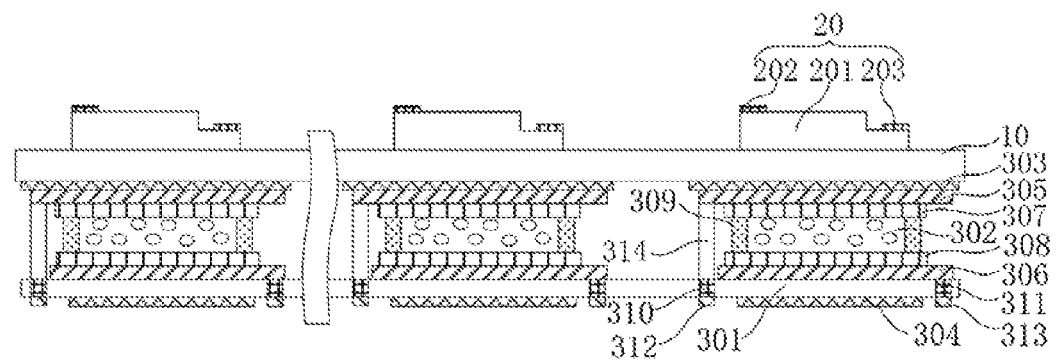

The step S204 is to assemble the base substrate 10 and the opposite substrate 301 by arranging the side of the base substrate 10 including the first alignment films 308 to face the side of the opposite substrate 301 including the liquid crystal layers 302, and to connect the respective third electrodes 314 with the first electrodes 312 through the corresponding first via-holes 310, as illustrated in FIG. 19f. In this way, the first deflection electrodes 305 are led out through the first via-holes 310, and the second deflection electrodes 306 are led out through the second via-holes 311, thus making it easier to lead out the deflection electrodes for controlling the liquid crystals to be deflected, so that the light-emitting diode chips can be fabricated in an array efficiently at a low cost.

For the structure as illustrated in FIG. 4 in which the base substrate is reused as the cathode of the light-emitting diode and the first deflection electrode, only the steps of forming the cathodes of the light-emitting diodes, and the first deflection electrodes in the steps S101 and S201 above can be dispensed with, but the other steps can be similar to the steps S201 to S204 above, so a repeated description thereof will be omitted here.

Figure 20:
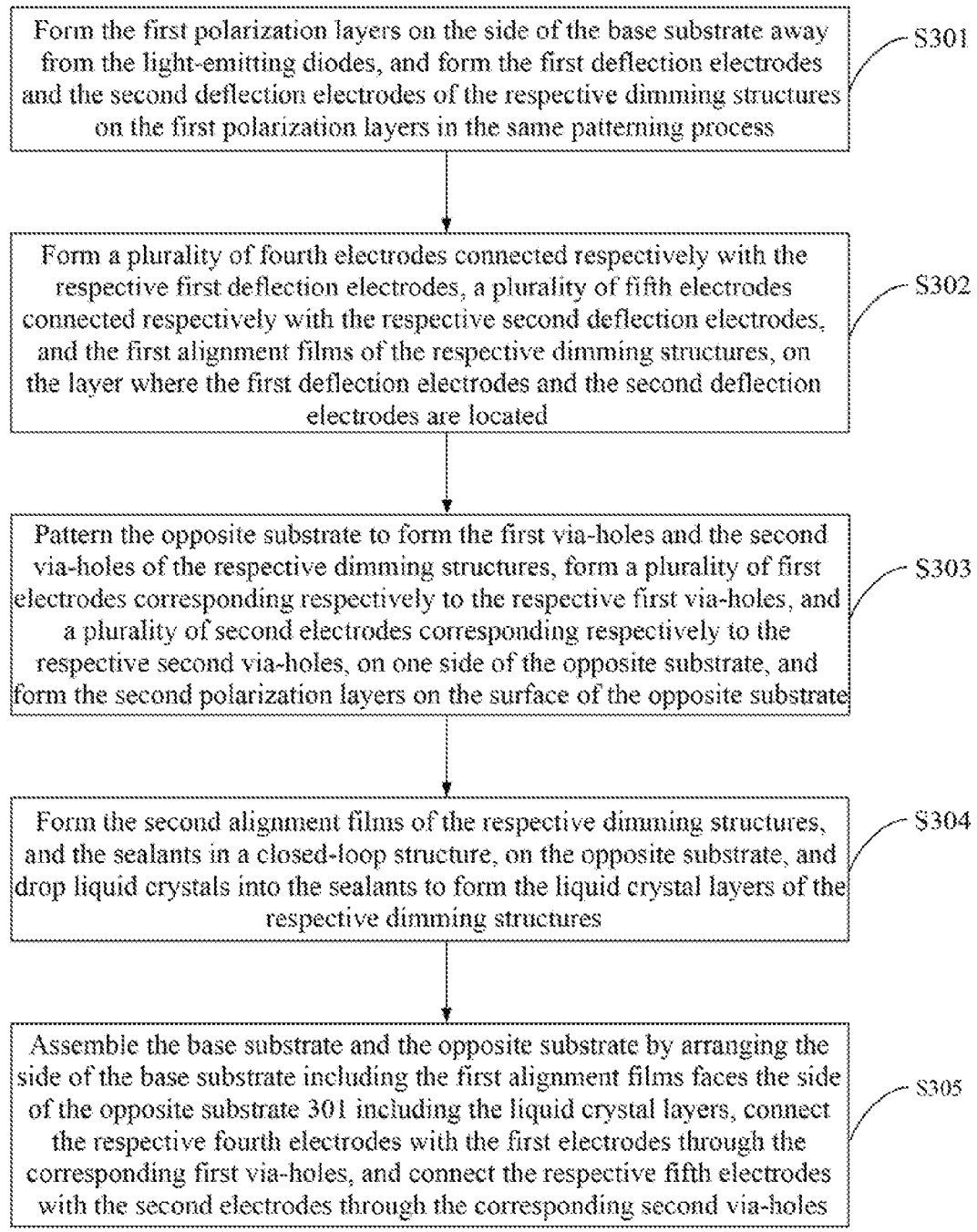
FIG. 20 is a third flow chart of the method for fabricating a light-emitting diode chip according to the embodiment of this disclosure.

For the structure as illustrated in FIG. 5 in which the first deflection electrode and the second deflection electrode are located at the same layer on the side of the liquid crystal layer proximate to the base substrate, as illustrated in FIG. 20, in the fabricating method above according to the embodiment of this disclosure, the step S102 above can include the following steps.

Figure 21A:
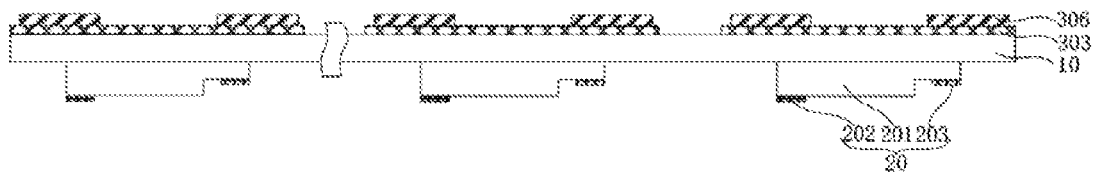
FIG. 21a to FIG. 21e are schematic structural diagrams corresponding to respective steps in the fabricating method according to the embodiment of this disclosure.

The step S301 is to form the first polarization layers 303 on the side of the base substrate 10 away from the light-emitting diodes 20, and to form the first deflection electrodes 305 and the second deflection electrodes 306 of the respective dimming structures above the first polarization layers 303 in the same patterning process, as illustrated in FIG. 21a. Since the first deflection electrodes 305 and the second deflection electrodes 306 are located at the same layer, the first deflection electrodes 305 and the second deflection electrodes 306 can be formed in the same patterning process to thereby reduce the thicknesses of the dimming structures, but also dispense with one pattering process so as to lower a fabrication cost.

Figure 21B:
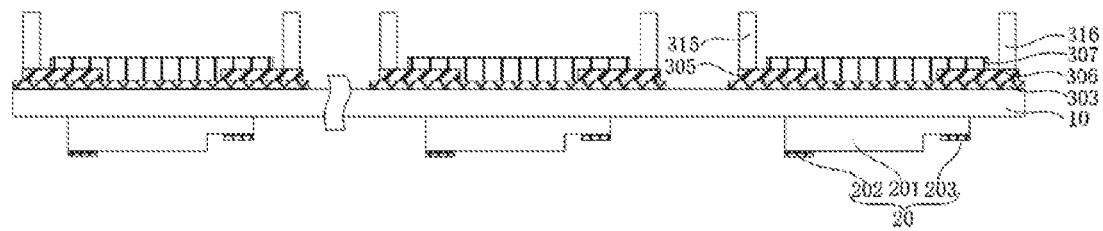

The step S302 is to form a plurality of fourth electrodes 315 connected respectively with the respective first deflection electrodes 305, a plurality of fifth electrodes 316 connected respectively with the respective second deflection electrodes 306, and the first alignment films 307 of the respective dimming structures, on the layer where the first deflection electrodes 305 and the second deflection electrodes 306 are located, as illustrated in FIG. 21b. The fourth electrodes 315 and the fifth electrodes 316 can be fabricated in the same patterning process to thereby save a fabrication process, and lower a fabrication cost.

Figure 21C:
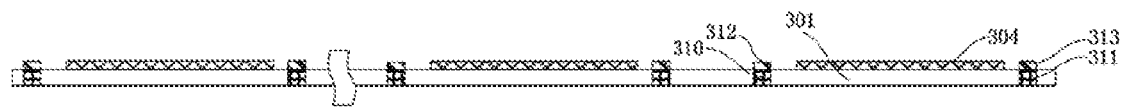

The step S303 is to pattern the opposite substrate 301 to form the first via-holes 310 and the second via-holes 311 of the respective dimming structures, to form a plurality of first electrodes 312 corresponding respectively to the respective first via-holes 310 and a plurality of second electrodes 313 corresponding respectively to the respective second via-holes 311 on one side of the opposite substrate 301, and to form the second polarization layers 304 on the surface of the opposite substrate, as illustrated in FIG. 21c. In order to avoid the second polarization layers 304 from shielding the first via-holes 310 and the second via-holes 311, the second polarization layers 304 can be formed on the surface of the opposite substrate other than the first via-holes 310 and the second via-holes 311.

Figure 21D:
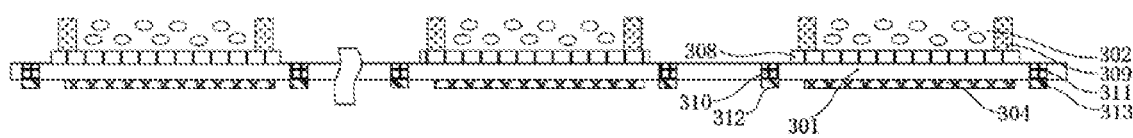

The step S304 is to form the second alignment films 308 of the respective dimming structures, and the sealants 309 in a closed-loop structure, above the opposite substrate, and to drop liquid crystals within the sealants 309 to form the liquid crystal layers 302 of the respective dimming structures, as illustrated in FIG. 21d. The first electrodes 310 and the second alignment films 308 are located on different sides of the opposite substrate 301, so after the step S303 above is performed, the opposite substrate 301 is inverted by 180°, and the respective layers in the step S304 are farther formed.

Figure 21E:
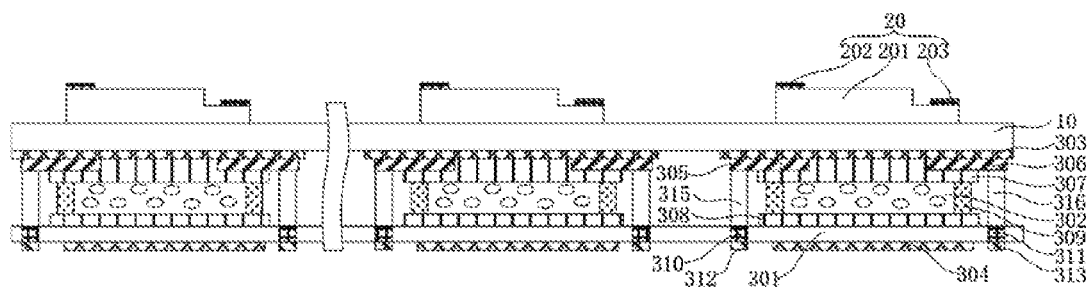

The step S305 is to assemble the base substrate 10 and the opposite substrate 301 by arranging the side of the base substrate 10 having the first alignment films 307 to face the side of the opposite substrate 301 having the liquid crystal layers 302, to connect the respective fourth electrodes 315 with the first electrodes 312 through the corresponding first via-holes 310, and to connect the respective fifth electrodes 316 with the second electrodes 313 through the corresponding second via-holes 311, as illustrated in FIG. 21e. In this way, the first deflection electrodes 305 are led out through the first via-holes 310, and the second deflection electrodes 306 are led out through the second via-holes 311, thus making it easier to lead out the deflection electrodes for controlling the liquid crystals to be deflected, so that the light-emitting diode chips can be fabricated in an array efficiently at a low cost.

Figure 22:
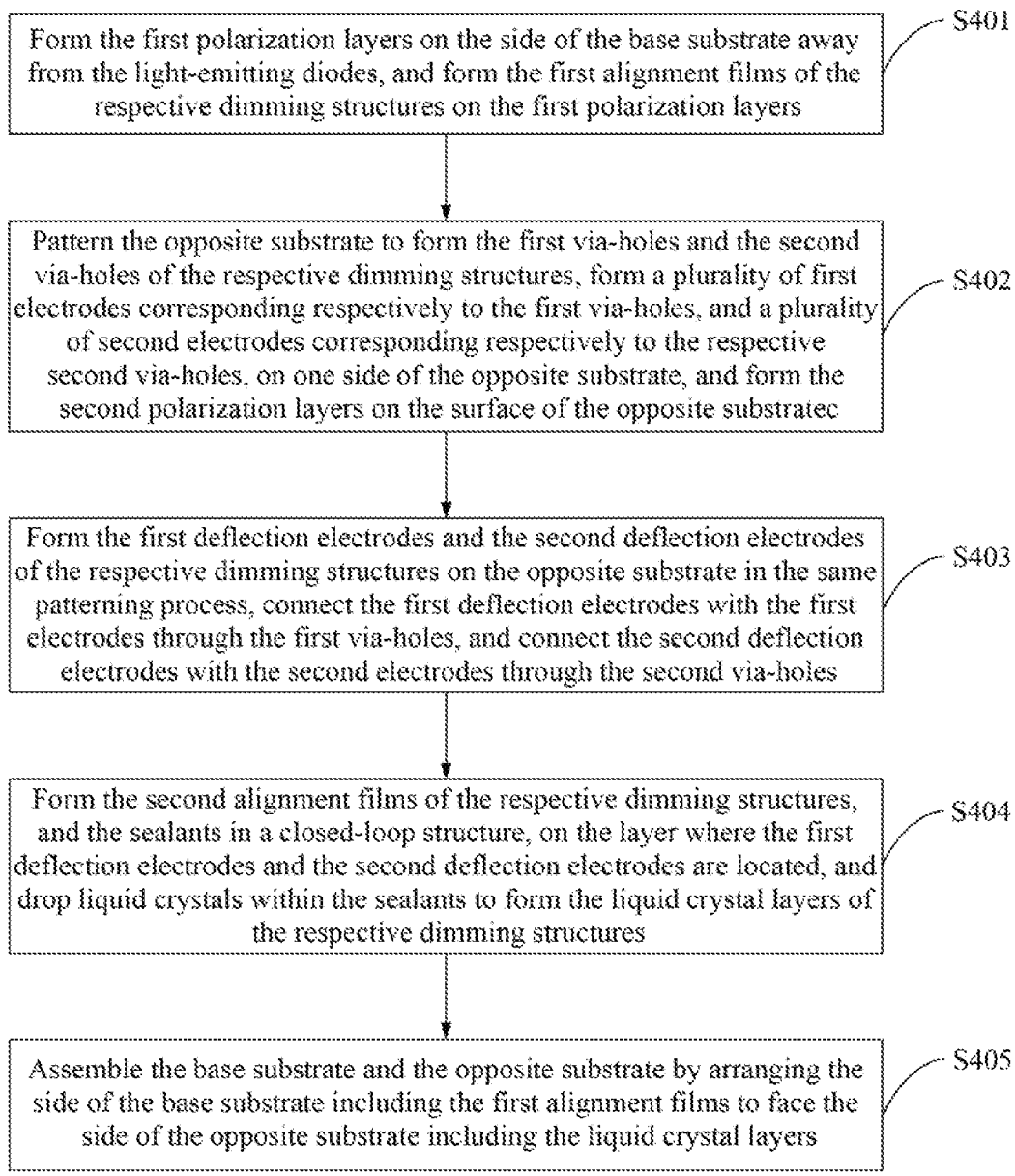
FIG. 22 is a fourth flow chart of the method for fabricating a light-emitting diode chip according to the embodiment of this disclosure.

For the structure as illustrated in FIG. 6 in which the first deflection electrode and the second deflection electrode are located at the same layer on the side of the liquid crystal layer proximate to the opposite substrate, and as illustrated in FIG. 22, in the fabricating method above according to the embodiment of this disclosure, the step S102 above can include the following steps.

Figure 23A:
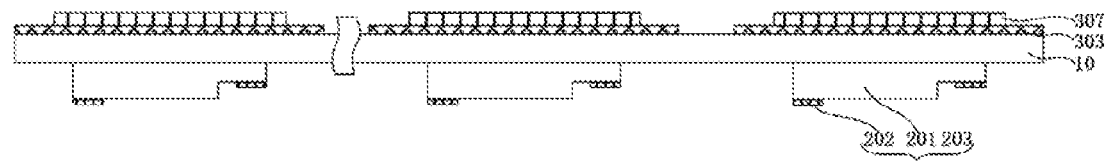
FIG. 23a to FIG. 23e are schematic structural diagrams corresponding to respective steps in the fabricating method according to the embodiment of this disclosure.

The step S401 is to form the first polarization layers 303 on the side of the base substrate 10 away from the light-emitting diodes 20, and to form the first alignment films 307 of the respective dimming structures above the first polarization layers 303, as illustrated in FIG. 23a.

Figure 23B:
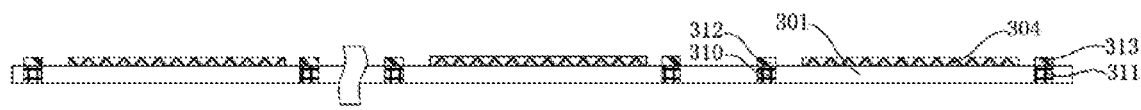

The step S402 is to pattern the opposite substrate 301 to form the first via-holes 310 and the second via-holes 311 of the respective dimming structures, to form a plurality of first electrodes 312 corresponding respectively to the first via-holes 310, and a plurality of second electrodes 313 corresponding respectively to the respective second via-holes 311, on one side of the opposite substrate 301, and to form the second polarization layers 304 on the surface of the opposite substrate 301, as illustrated in FIG. 23b.

Figure 23C:
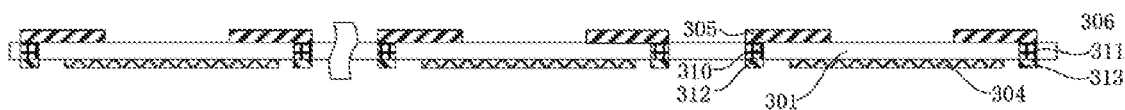

The step S403 is to form the first deflection electrodes 305 and the second deflection electrodes 306 of the respective dimming structures above the opposite substrate 301 in the same patterning process, to connect the first deflection electrodes 305 with the first electrodes 312 through the first via-holes 310, and to connect the second deflection electrodes 306 with the second electrodes 313 through the second via-holes 311, as illustrated in FIG. 23c. In order to lead out the first deflection electrodes 305 and the second deflection electrodes 306, the second polarization layers 304 can be arranged on the side of the opposite substrate 301 away from the liquid crystal layers 302, and the first deflection electrodes 305 and the second deflection electrodes 306 can be formed directly on the side of the opposite substrate 301 proximate to the liquid crystal layers 302.

Figure 23D:
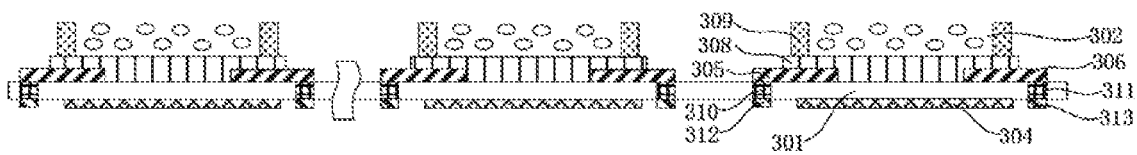

The step S404 is to form the second alignment films 308 of the respective dimming structures, and the sealants 309 in a closed-loop structure, on the layer where the first deflection electrodes 305 and the second deflection electrodes 306 are located, and to drop liquid crystals within the sealants 309 to form the liquid crystal layers 302 of the respective dimming structures, as illustrated in FIG. 23d.

Figure 23E:
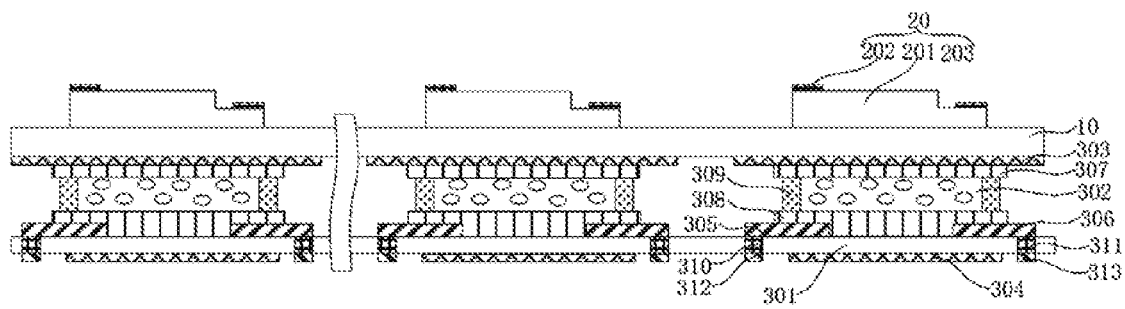

The step S405 is to assemble the base substrate 10 and the opposite substrate 301 by arranging the side of the base substrate 10 having the first alignment films 307 to face to the side of the opposite substrate 301 having the liquid crystal layers 302 as illustrated in FIG. 23e. In this way, the first deflection electrodes 305 are led out through the first via-holes 310, and the second deflection electrodes 306 are led out through the second via-holes 311, thus making it easier to lead out the deflection electrodes for controlling the liquid crystals to be deflected, so that the light-emitting diode chips can be fabricated in an array efficiently at a low cost.

In the light-emitting diode chip, the method for fabricating the same, the backlight module, and the display device above according to the embodiments of this disclosure, the dimming structure is arranged on the side of the base substrate away from the light-emitting diode to adjust the intensity of light emitted from the side of the base substrate away from the light-emitting diode, so as to individually control the intensity of light emitted from one side of the light-emitting diode chip capable of emitting light from double sides thereof. When the light-emitting diode chip above is applied to the display device, the display device can be provided with a backlight source for displaying an image, and a light source for supplementing light while photographing, without arranging any additional separate light source in the display device, thus lowering a cost, and narrowing a space to be occupied by the light-supplementing light source, which can cater to the miniaturization trend of a mobile terminal. Furthermore since the dimming structure can adjust the intensity of the light from the secondary light exit side, neither additional switch module nor additional light-supplementing component needs to be installed in the display device to thereby reduce the volume of the display device, and avoid complex operation of the additionally connected light-supplementing component, thus simplifying the structure and also saving the cost.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A light-emitting diode chip, comprising:
a transparent base substrate;
at least one light-emitting diode located on one side of the base substrate; and
a dimming structure located on a side of the base substrate away from the light-emitting diode, wherein:
the light-emitting diode is configured to emit light from double sides thereof; and
the dimming structure is configured to adjust an intensity of light emitted from the side of the base substrate away from the light-emitting diode;
wherein the dimming structure comprises:
an opposite substrate;
a liquid crystal layer located between the base substrate and the opposite substrate;
a first polarization layer located on a side of the liquid crystal layer away from the opposite substrate;
a second polarization layer located on a side of the liquid crystal layer away from the first polarization layer;
deflection electrodes, located between the base substrate and the opposite substrate, configured to control liquid crystal molecules in the liquid crystal layer to be deflected;
a first alignment film located on the side of the liquid crystal layer away from the opposite substrate;
a second alignment film located on a side of the liquid crystal layer away from the first alignment film; and
a sealant, located between the first alignment film and the second alignment film, configured to seal the liquid crystal layer.

2. The light-emitting diode chip according to claim 1, wherein the deflection electrodes comprise a first deflection electrode and a second deflection electrode;
the dimming structure further comprises: a first via-hole and a second via-hole arranged on the opposite substrate, a first electrode arranged on a side of the opposite substrate away from the base substrate and corresponding to the first via-hole, and a second electrode arranged on the side of the opposite substrate away from the base substrate and corresponding to the second via-hole; and
the first deflection electrode is connected with the first electrode through the first via-hole, and the second deflection electrode is connected with the second electrode through the second via-hole.

3. The light-emitting diode chip according to claim 2, wherein the first deflection electrode is located on the side of the liquid crystal layer away from the opposite substrate, and the second deflection electrode is located on the side of the liquid crystal layer away from the first deflection electrode.

4. The light-emitting diode chip according to claim 3, wherein the dimming structure further comprises a third electrode located on a side of the opposite substrate facing the base substrate;
an orthographic projection of the third electrode onto the base substrate lies out of a closed-loop structure defined by an orthographic projection of the sealant onto the base substrate; and
the first deflection electrode is connected with the third electrode, and the third electrode is connected with the first electrode through the first via-hole.

5. The light-emitting diode chip according to claim 3, wherein the base substrate is made of a conductive material;
the first polarization layer is located on a side of the first deflection electrode proximate to the opposite substrate; and the base substrate is further used as the first deflection electrode and a cathode of the light-emitting diode.

6. The light-emitting diode chip according to claim 2, wherein the first deflection electrode and the second deflection electrode are arranged at a same layer, and the first deflection electrode and the second deflection electrode are arranged to be insulated from each other.

7. The light-emitting diode chip according to claim 6, wherein the first deflection electrode and the second deflection electrode are located on the side of the liquid crystal layer away from the opposite substrate;
the dimming structure further comprises a fourth electrode and a fifth electrode located on a side of the opposite substrate facing the base substrate;
an orthographic projection of the fourth electrode and an orthographic projection of the fifth electrode onto the base substrate lie out of a closed-loop structure defined by an orthographic projection of the sealant onto the base substrate;
the first deflection electrode is connected with the fourth electrode, and the fourth electrode is connected with the first electrode through the first via-hole; and
the second deflection electrode is connected with the fifth electrode, and the fifth electrode is connected with the second electrode through the second via-hole.

8. The light-emitting diode chip according to claim 6, wherein the first deflection electrode and the second deflection electrode are located on a side of the liquid crystal layer facing the opposite substrate.

9. The light-emitting diode chip according to claim 2, wherein an orthographic projection of the second polarization layer onto the opposite substrate does not overlap with the first via-hole and the second via-hole.

10. The light-emitting diode chip according to claim 2, wherein the dimming structure further comprises: a first conductive material filled in the first via-hole, and a second conductive material filled in the second via-hole;
the first deflection electrode is connected with the first electrode through the first conductive material; and
the second deflection electrode is connected with the second electrode through the second conductive material.

11. A backlight module, comprising the light-emitting diode chip according to claim 1.

12. The backlight module according to claim 11, further comprising an encapsulation bracket configured to encapsulate the light-emitting diode chip;
wherein the encapsulation bracket comprises a first light exit and a second light exit arranged opposite to each other;
light emitted from the light-emitting diode chip from a side of the base substrate facing the light-emitting diode exits at the first light exit, and the light emitted from the light-emitting diode chip from the side of the base substrate away from the light-emitting diode exits at the second light exit.

13. The backlight module according to claim 12, wherein the backlight module further comprises: a frame comprising an accommodating chamber, and a blocking wall surrounding the frame;
the frame is arranged with a dodge groove in correspondence to the second light exit of the encapsulation bracket; and
the blocking wall is arranged with a third light exit in correspondence to the dodge groove.

14. A display device, comprising the backlight module according to claim 11.

15. The display device according to claim 14, further comprising: a housing and a light transmission structure;
wherein a light-supplementing hole is arranged on the housing; and
the light transmission structure comprises: a light entrance corresponding to a third light exit of the backlight module, a light exit corresponding to the light-supplementing hole, a light-shielding structure, which is openable and closable, located at the light exit, and a control module configured to control an extent to which the light-shielding structure is opened and closed.

16. A method for fabricating the light-emitting diode chip according to claim 1, comprising:
forming a plurality of light-emitting diodes on the one side of the transparent base substrate;
forming a plurality of dimming structures on the side of the base substrate away from the light-emitting diodes to form a plurality of light-emitting diode chips, wherein the dimming structures each correspond to at least one of the light-emitting diodes; and
segmenting the formed plurality of light-emitting diode chips into single light-emitting diode chips.

17. The fabricating method according to claim 16, wherein forming the plurality of dimming structures on the side of the base substrate away from the light-emitting diodes comprises:
forming first polarization layers, first deflection electrodes of the plurality of dimming structures, a plurality of third electrodes connected respectively with the first deflection electrodes, and first alignment films of the dimming structures successively on the side of the base substrate away from the light-emitting diodes;
patterning an opposite substrate to form first via-holes and second via-holes of the dimming structure; and forming a plurality of first electrodes corresponding respectively to the first via-holes, and a plurality of second electrodes corresponding respectively to the second via-holes on one side of the opposite substrate, and forming second polarization layers on the surface of the opposite substrate;
forming second deflection electrodes of the dimming structures on a side of the opposite substrate away from the first electrodes, and connecting the second deflection electrodes with the second electrodes through the second via-holes; forming the corresponding second alignment films and sealants in a closed-loop structure on the second deflection electrodes; and dropping liquid crystals within the sealants to form liquid crystal layers of the dimming structures; and
assembling the base substrate and the opposite substrate by arranging a side of the base substrate including the first alignment films to face a side of the opposite substrate comprising the liquid crystal layers, and connecting the third electrodes with the first electrodes through the corresponding first via-holes.

18. The fabricating method according to claim 16, wherein forming the plurality of dimming structures on the side of the base substrate away from the light-emitting diodes comprises:
forming first polarization layers on the side of the base substrate away from the light-emitting diodes, and forming first deflection electrodes and second deflection electrodes of the dimming structures on the first polarization layers in a same patterning process;
forming a plurality of fourth electrodes connected respectively with the first deflection electrodes, a plurality of fifth electrodes connected respectively with the second deflection electrodes, and first alignment films of the dimming structures, on the layer where the first deflection electrodes and the second deflection electrodes are located;

patterning an opposite substrate to form first via-holes and second via-holes of the dimming structures, forming a plurality of first electrodes corresponding respectively to the first via-holes, and a plurality of second electrodes corresponding respectively to the second via-holes, on one side of the opposite substrate, and forming second polarization layers on the surface of the opposite substrate;

forming second alignment films of the dimming structures, and sealants in a closed-loop structure, on the opposite substrate, and dropping liquid crystals within the sealants to form liquid crystal layers of the dimming structures; and assembling the base substrate and the opposite substrate by arranging a side of the base substrate including the first alignment films to face a side of the opposite substrate comprising the liquid crystal layers, connecting the fourth electrodes with the first electrodes through the corresponding first via-holes, and connecting the fifth electrodes with the second electrodes through the corresponding second via-holes.

19. The fabricating method according to claim 16, wherein forming the plurality of dimming structures on the side of the base substrate away from the light-emitting diodes comprises:

forming first polarization layers on the side of the base substrate away from the light-emitting diodes, and forming first alignment films of the dimming structures on the first polarization layers;

patterning an opposite substrate to form first via-holes and second via-holes of the dimming structures, forming a plurality of first electrodes corresponding respectively to the first via-holes, and a plurality of second electrodes corresponding respectively to the second via-holes, on one side of the opposite substrate, and forming second polarization layers on the surface of the opposite substrate;

forming first deflection electrodes and second deflection electrodes of the dimming structures on the opposite substrate in a same patterning process, connecting the first deflection electrodes with the first electrodes through the first via-holes, and connecting the second deflection electrodes with the second electrodes through the second via-holes;

forming second alignment films of the dimming structures, and sealants in a closed-loop structure, on a layer where the first deflection electrodes and the second deflection electrodes are located, and dropping liquid crystals within the sealants to form liquid crystal layers of the dimming structures; and assembling the base substrate and the opposite substrate by arranging a side of the base substrate including the first alignment films to face a side of the opposite substrate comprising the liquid crystal layers.

\* \* \* \* \*